(12) United States Patent
Song et al.

(10) Patent No.: US 8,039,325 B2
(45) Date of Patent: Oct. 18, 2011

(54) METHODS OF FABRICATING SEMICONDUCTOR DEVICE HAVING CAPACITORLESS ONE-TRANSISTOR MEMORY CELL

(75) Inventors: Ho-Ju Song, Seoul (KR); Sung-Hwan Kim, Suwon-si (KR); Yong-Chul Oh, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/654,333

(22) Filed: Dec. 17, 2009

(65) Prior Publication Data

US 2010/0159650 A1 Jun. 24, 2010

(30) Foreign Application Priority Data

Dec. 18, 2008 (KR) .................. 10-2008-0129318

(51) Int. Cl.
*H01L 21/00* (2006.01)
*H01L 21/84* (2006.01)
*H01L 21/3205* (2006.01)
*H01L 21/4763* (2006.01)

(52) U.S. Cl. .................. 438/155; 438/585; 257/E21.7

(58) Field of Classification Search .................. None
See application file for complete search history.

(56) References Cited

U.S. PATENT DOCUMENTS

| 5,146,152 | A | 9/1992 | Jin et al. |
| 5,953,263 | A | 9/1999 | Farmwald et al. |
| 5,998,840 | A | 12/1999 | Kim |
| 6,055,183 | A | 4/2000 | Ho et al. |
| 6,060,750 | A | 5/2000 | Hisamoto et al. |
| 6,084,812 | A | 7/2000 | Joo |
| 6,147,903 | A | 11/2000 | Takahashi |
| 6,475,890 | B1 | 11/2002 | Yu |
| 6,567,330 | B2 | 5/2003 | Fujita et al. |
| 6,621,725 | B2 | 9/2003 | Ohsawa |
| 6,697,909 | B1 | 2/2004 | Wang et al. |
| 6,723,638 | B1 | 4/2004 | He et al. |
| 6,826,074 | B2 | 11/2004 | Yamauchi |
| 6,861,689 | B2 | 3/2005 | Burnett |

(Continued)

FOREIGN PATENT DOCUMENTS

JP 04-366492 A 12/1992

(Continued)

OTHER PUBLICATIONS

Cho, Changhyun, "A $6F^2$ DRAM Technology in 60nm era for Gigabit Densities", 2005 Symposium on VLSI Technology Digest of Technical Papers, pp. 36-37, (2005).

(Continued)

*Primary Examiner* — Ha Tran T Nguyen
*Assistant Examiner* — Valerie N Brown
(74) *Attorney, Agent, or Firm* — Lee & Morse, P.C.

(57) ABSTRACT

A method of fabricating a semiconductor device having a capacitorless one-transistor memory cell includes forming a first floating body pattern on a lower insulating layer of a substrate and a first gate pattern crossing over the first floating body pattern and covering sidewalls of the first floating body pattern is formed. The first floating body pattern at both sides of the first gate pattern is partially etched to form a protrusion portion extending between and above the partially etched regions, and first impurity regions are formed in the partially etched regions of the first floating body pattern.

14 Claims, 25 Drawing Sheets

U.S. PATENT DOCUMENTS

| | | |
|---|---|---|
| 6,861,889 B2 | 3/2005 | Tobita |
| 6,882,008 B1 | 4/2005 | Ohsawa |
| 6,982,918 B2 | 1/2006 | Fazan et al. |
| 7,035,147 B2 | 4/2006 | Yeh et al. |
| 7,064,973 B2 | 6/2006 | Peng et al. |
| 7,075,151 B2 | 7/2006 | Shino |
| 7,098,507 B2 * | 8/2006 | Tang et al. .................. 257/347 |
| 7,154,788 B2 | 12/2006 | Takemura et al. |
| 7,170,807 B2 | 1/2007 | Fazan et al. |
| 7,187,581 B2 | 3/2007 | Ferrant et al. |
| 7,233,536 B2 | 6/2007 | Ogiwara et al. |
| 7,301,803 B2 | 11/2007 | Okhonin et al. |
| 7,326,634 B2 * | 2/2008 | Lindert et al. ............... 438/585 |
| 7,338,862 B2 | 3/2008 | Huo et al. |
| 7,436,724 B2 | 10/2008 | Nandi |
| 7,442,988 B2 | 10/2008 | Oh et al. |
| 7,872,840 B1 | 1/2011 | Vashchenko et al. |
| 7,924,644 B2 | 4/2011 | Park et al. |
| 2002/0057622 A1 | 5/2002 | Sim |
| 2003/0231524 A1 | 12/2003 | Ohsawa |
| 2004/0256683 A1 | 12/2004 | Lee et al. |
| 2005/0026354 A1 | 2/2005 | Bhattacharyya |
| 2005/0068807 A1 | 3/2005 | Ohsawa |
| 2005/0180214 A1 | 8/2005 | Park |
| 2006/0081851 A1 | 4/2006 | Ono |
| 2006/0092739 A1 | 5/2006 | Fujita et al. |
| 2006/0131650 A1 | 6/2006 | Okhonin et al. |
| 2006/0138558 A1 | 6/2006 | Morikado |
| 2006/0208301 A1 | 9/2006 | Shino |
| 2007/0007574 A1 | 1/2007 | Ohsawa |
| 2007/0013007 A1 | 1/2007 | Kusunoki et al. |
| 2007/0023809 A1 | 2/2007 | Villaret et al. |
| 2007/0051994 A1 | 3/2007 | Song et al. |
| 2007/0058427 A1 | 3/2007 | Okhonin et al. |
| 2007/0090443 A1 | 4/2007 | Choi et al. |
| 2007/0091703 A1 | 4/2007 | Nishimura et al. |
| 2007/0097751 A1 | 5/2007 | Popoff et al. |
| 2007/0158727 A1 | 7/2007 | Song et al. |
| 2007/0161181 A1 | 7/2007 | Song et al. |
| 2007/0285982 A1 | 12/2007 | Carman |
| 2008/0012439 A1 | 1/2008 | Wu et al. |
| 2008/0123439 A1 | 5/2008 | Park et al. |
| 2008/0130376 A1 | 6/2008 | Park et al. |
| 2008/0278473 A1 | 11/2008 | An |
| 2008/0284493 A1 | 11/2008 | Baek et al. |
| 2008/0303095 A1 | 12/2008 | Xiong et al. |
| 2009/0026519 A1 | 1/2009 | Jin et al. |
| 2010/0149886 A1 | 6/2010 | Song et al. |

FOREIGN PATENT DOCUMENTS

| | | |
|---|---|---|
| JP | 2003-031696 A | 1/2003 |
| JP | 2003-068877 A | 3/2003 |
| JP | 2003-132682 A | 5/2003 |
| JP | 2006-085812 A | 3/2006 |
| JP | 2006-107560 A | 4/2006 |
| JP | 2006-108396 A | 4/2006 |
| JP | 2006-156986 A | 6/2006 |
| JP | 2006-179746 A | 7/2006 |
| JP | 2006-260722 A | 9/2006 |
| JP | 2007-018588 A | 1/2007 |
| JP | 2007-036257 A | 2/2007 |
| JP | 2007-073680 A | 3/2007 |
| KR | 10-1994-0003406 A | 2/1994 |
| KR | 10-0248507 B1 | 12/1999 |
| KR | 10-2002-0014757 A | 2/2002 |
| KR | 10-2003-0015823 A | 2/2003 |
| KR | 10-0429868 B1 | 4/2004 |
| KR | 10-2005-0071665 A | 7/2005 |
| KR | 10-2006-0104794 A | 10/2006 |
| KR | 10-0660910 B1 | 12/2006 |
| KR | 10-0673012 B1 | 1/2007 |
| KR | 10-0682537 B1 | 2/2007 |
| KR | 10-0699890 B1 | 3/2007 |
| KR | 10 2008-0047105 A | 5/2008 |
| KR | 10-2008-0058806 A | 6/2008 |

OTHER PUBLICATIONS

Jeong, Hoon, et al., "A Capacitor-less IT DRA Cell Based on a Surrounding Gate MOSFET with a Vertical Channel", 2005 IEEE Silicon Nanoelectronics Workshop, pp. 92-93 (2005).

Oh, Chang Woo, et al., "Floating Body DRAM Chracteristics of Silicon-On-ONO (SOONO) Devices for System-on-Chip (SoC) Applications", 2007 Symposium on VLSI Technology Digest of Technical Papers, pp. 168-169, (2007).

Ohsawa, Takashi, et al., "Memory Design Using a One-Transistor Gain Cell on SOI", IEEE Journal of Solid-State Circuits, vol. 37, No. 11, pp. 1510-1522, (2002).

Ohsawa, Takashi, et al., "A Memory Using One-Transistor Gain Cell on SOI(FBC) with Performance Suitable for Embedded DRAM's", 2003 Symposium on VLSI Circuits Digest of Technical Papers, pp. 93-96, (2003).

Ohsawa, Takashi, et al., "An 18.5ns 128Mb SOI DRAM with a Floating Body Cell", 2005 IEEE International Solid-State Circuits Conference, pp. 458, 459, 609, (2005).

Ota, K., et al., "Novel Locally Strained Channel Technique for High Performance 55nm CMOS", IEDM, pp. 27-30, IEEE © 2002.

"Capacitor-less 1T DRAM cell structure for sensing margin and retention time enhancement", 2007 The Korean Conference on Semiconductors, 2 pg. (2007).

Bron, et al.; A 2ns Read Latency, 4Mb Embedded Z-RAM® Floating Body Memory Macro in 45nm SOI Technology; Innovative Silicon, Lausanne, Switzerland, Feb. 2009.

Song, et al.; 55nm Capacitor-less IT DRAM Cell Transistor with Non-Overlap Structure; Samsung Electronics Co., Hwasung, Gyeonggi, Korea, Dec. 2008.

Ohsawa, et al.; Memory Design Using a One-Transistor Gain Cell on SOI; Nov. 2002; 1510-1522; vol. 37, No. 11; IEEE Journal of Solid State Circuits.

Matloubian, et al.; Modeling of the Subthreshold Characteristics of SOI MOSFET's with Floating Body; IEEE Transaction on Electron Devices; Sep. 1990; pp. 1985-1994; vol. 37, No. 9; IEEE; United States.

* cited by examiner

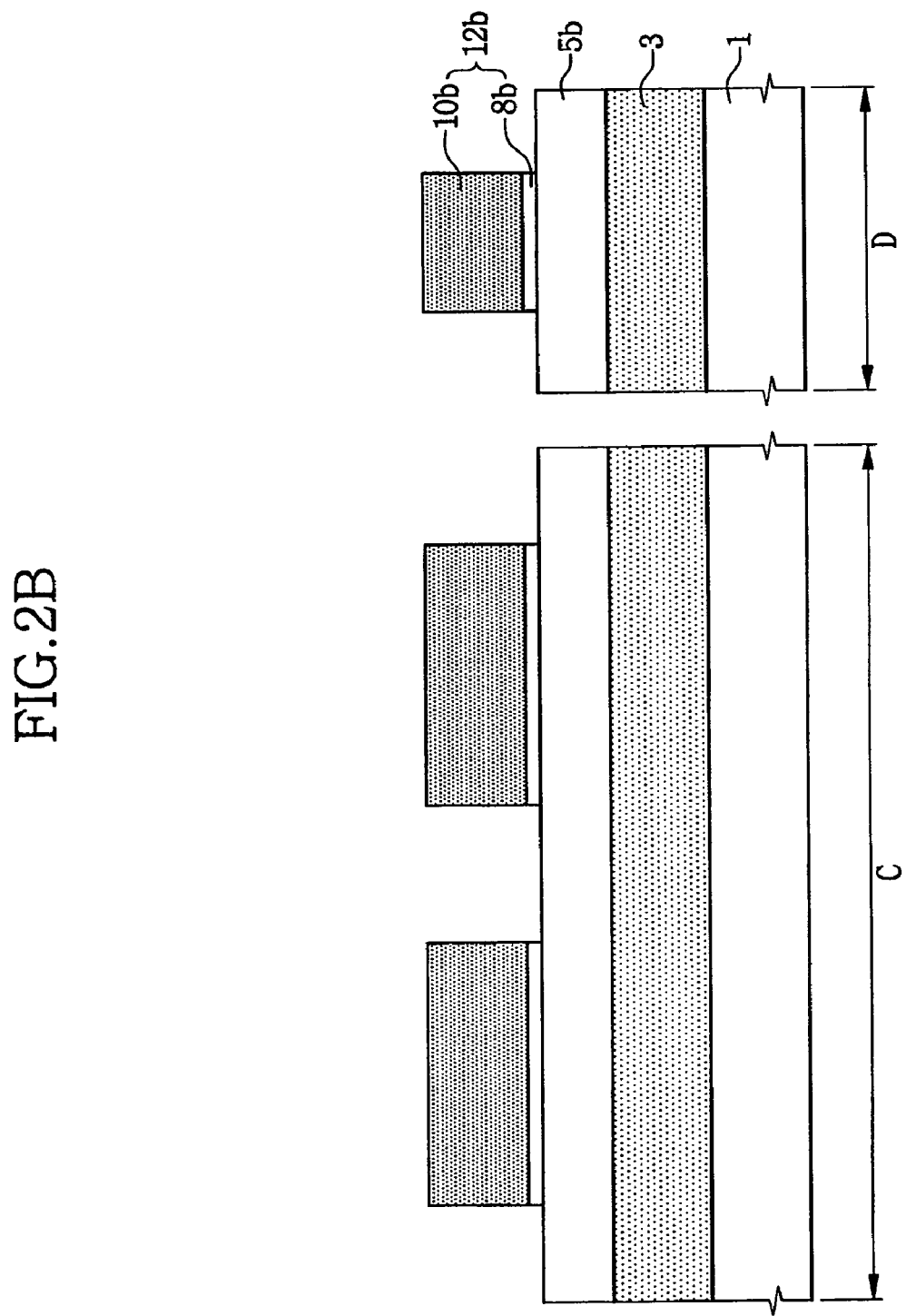

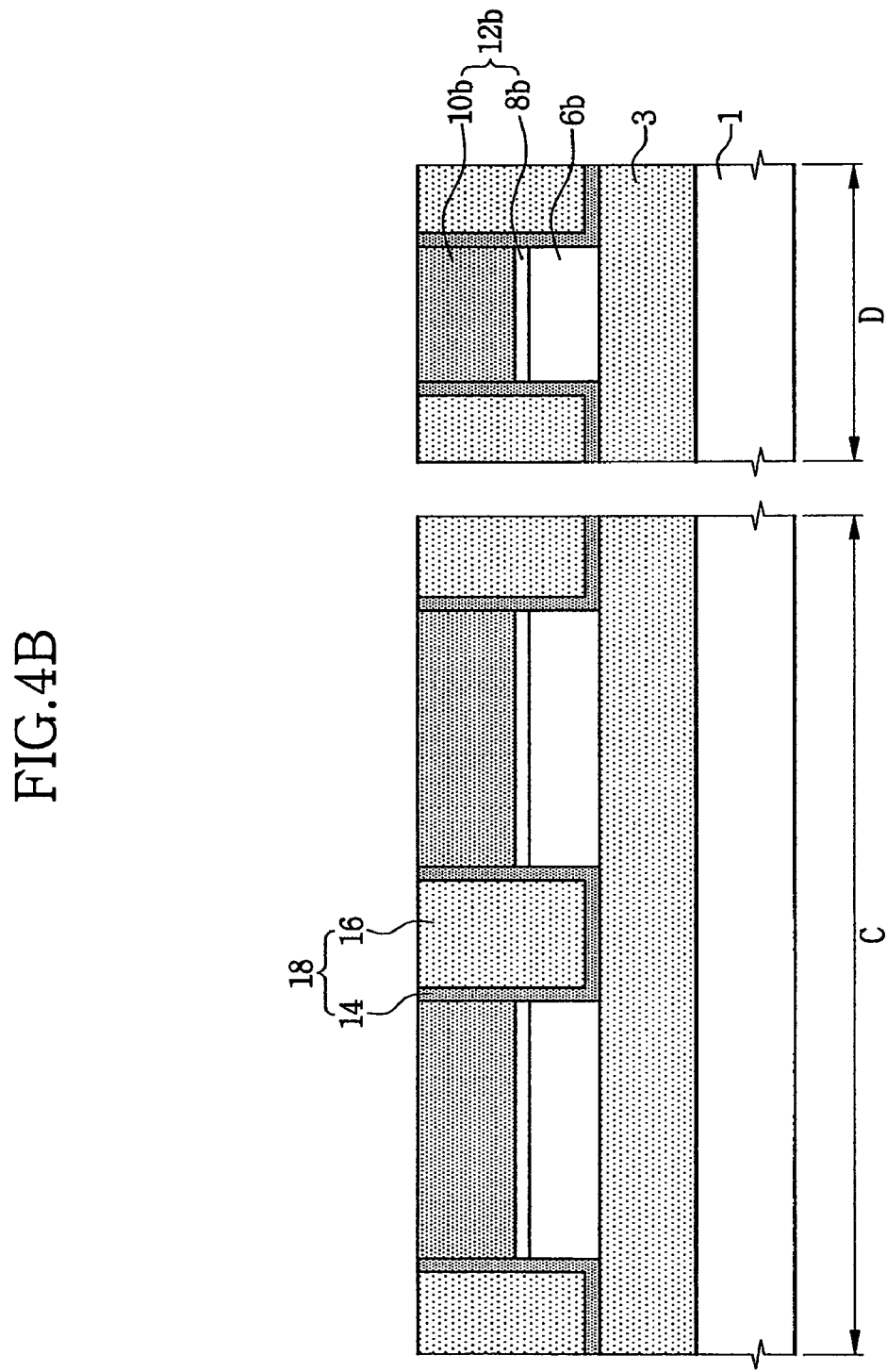

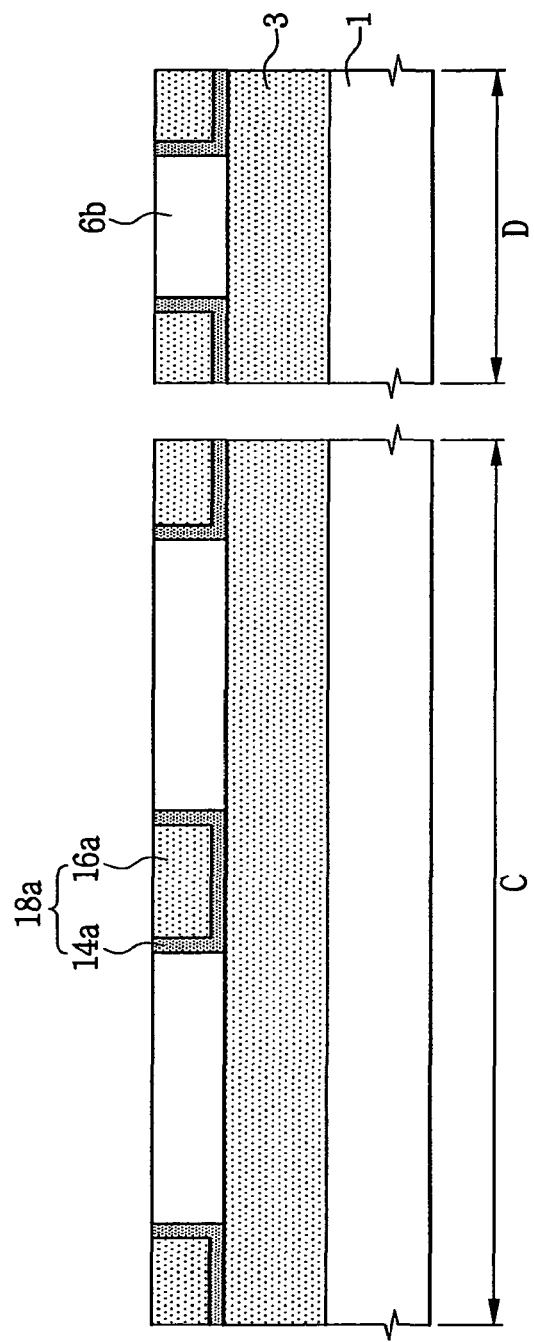

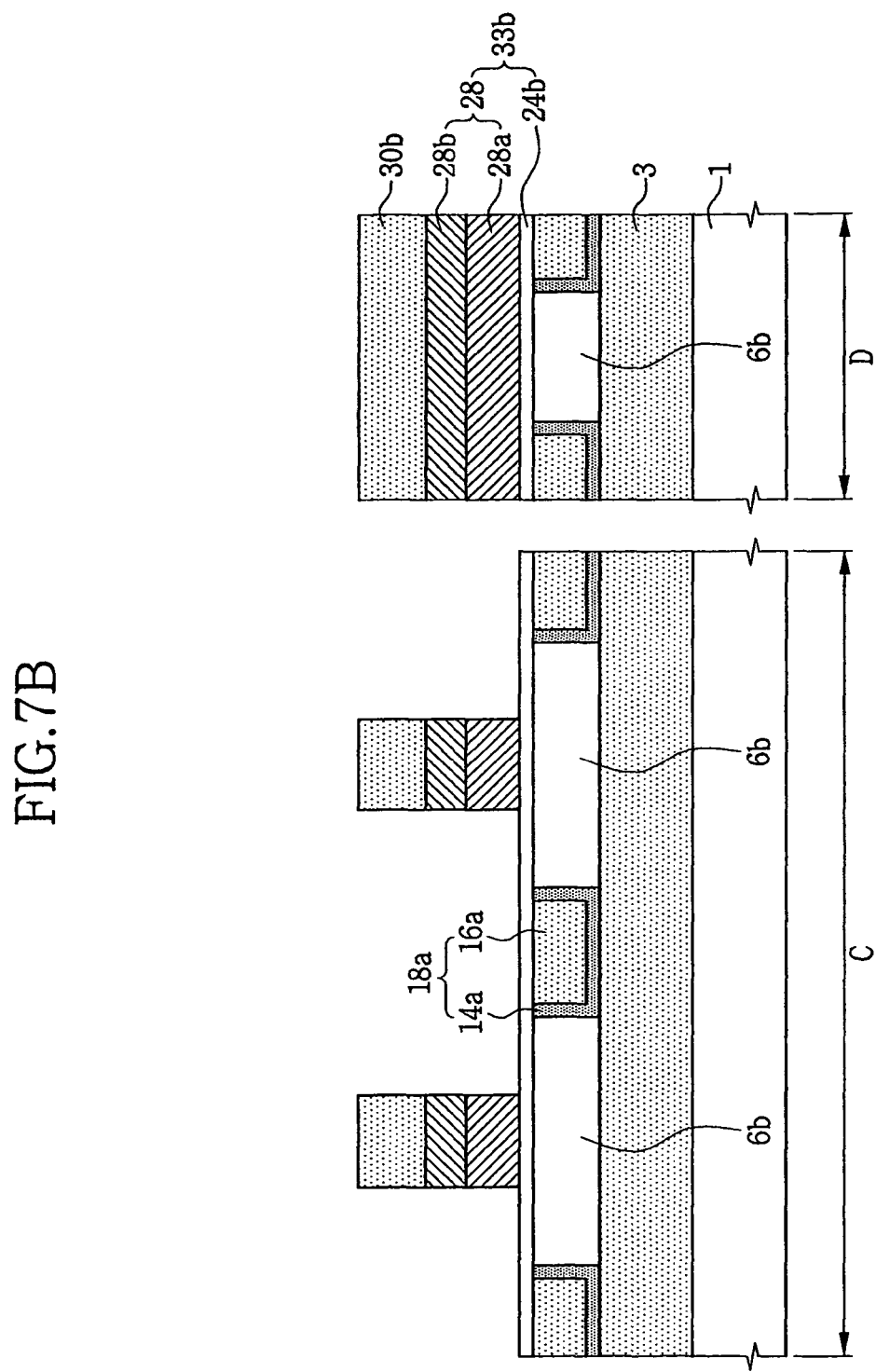

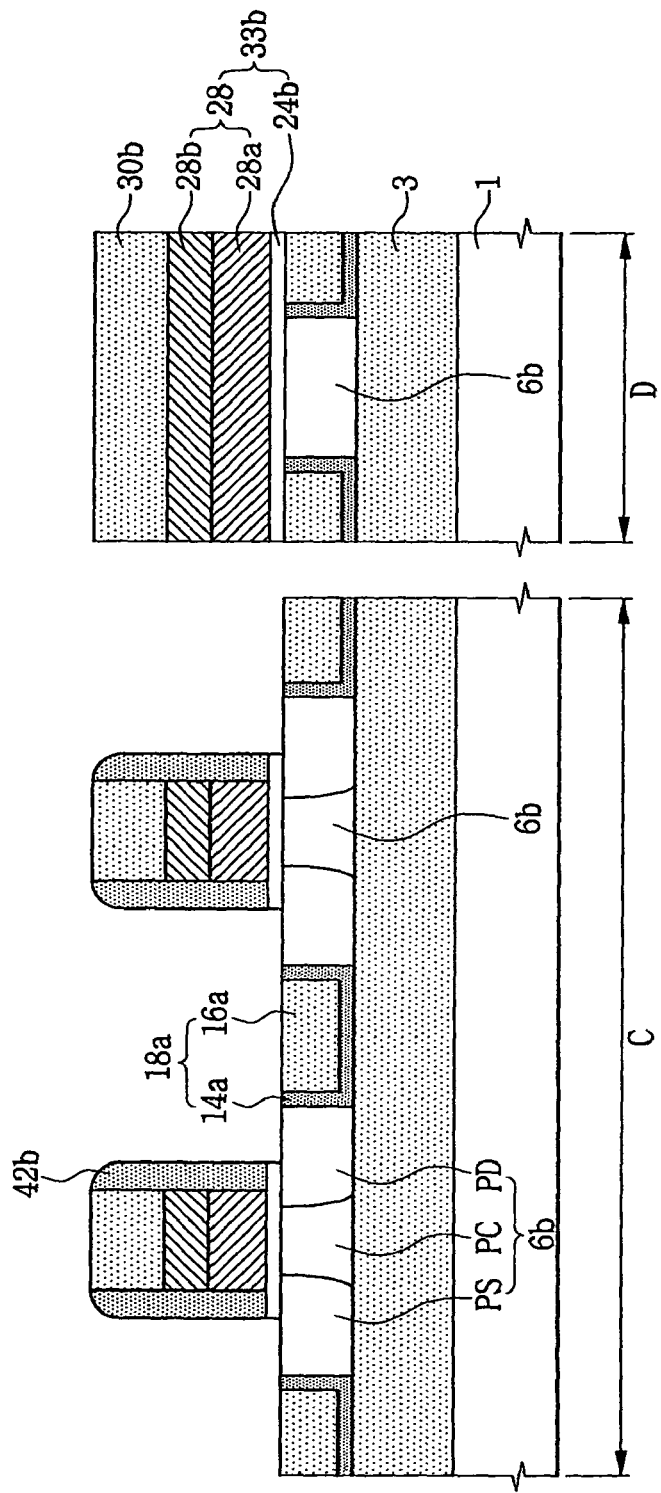

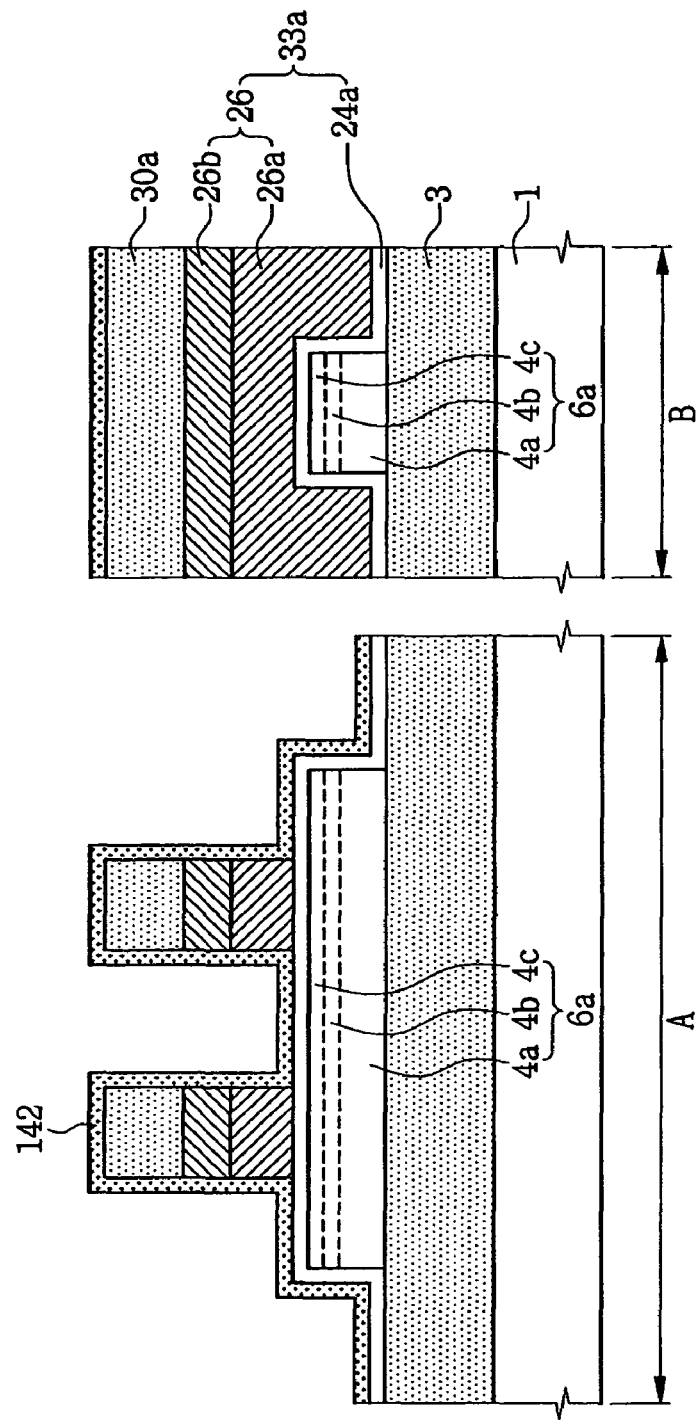

METHODS OF FABRICATING SEMICONDUCTOR DEVICE HAVING CAPACITORLESS ONE-TRANSISTOR MEMORY CELL

BACKGROUND

1. Field

Example embodiments relate to a method of fabricating a semiconductor device. More particularly, example embodiments relate to a method of fabricating a semiconductor device having a capacitorless one-transistor memory cell with improved data retention capability and operating characteristics.

2. Description of Related Art

A unit cell of a DRAM device may include a cell capacitor and an access transistor. In general, the cell capacitor is three-dimensionally formed by a complicated process. High integration of such a three-dimensional cell capacitor may be limited in the DRAM device. Therefore, research into data storage capable of replacing the three-dimensional cell capacitor has been underway.

SUMMARY

Embodiments are therefore directed to a method of fabricating a semiconductor device having a capacitorless one-transistor memory cell, which substantially overcomes one or more of the problems due to the limitations and disadvantages of the related art.

It is therefore a feature of an embodiment to provide a method of fabricating a semiconductor device having a capacitorless one-transistor memory cell exhibiting improved data retention capability and operating characteristics.

At least one of the above and other features and advantages may be realized by providing a method of fabricating a semiconductor device, including forming a first floating body pattern on a lower insulating layer of a substrate. A first gate pattern crossing over the first floating body pattern and covering sidewalls of the first floating body pattern may be formed. The first floating body pattern at both sides of the first gate pattern may be partially etched, and the first floating body pattern may have a protrusion portion more protruding than the partially etched regions between the partially etched regions. First impurity regions may be formed in the partially etched regions of the first floating body pattern.

The method may further include forming a second floating body pattern spaced apart from the first floating body pattern on the insulating layer while the first floating body pattern is formed, and forming a second gate pattern crossing over the second floating body pattern while the first gate pattern is formed.

Meanwhile, the method may further include forming an isolation pattern surrounding sidewalls of the second floating body pattern. Forming the isolation pattern may include forming an isolation layer on the substrate having the first and second floating body patterns, wherein the isolation layer includes an insulating liner and an isolation insulating layer on the insulating liner, and the insulating liner is formed of a material layer having an etch selectivity with respect to the bottom insulating layer and the isolation insulating layer; and sequentially etching the isolation insulating layer and the insulating liner adjacent to the first floating body pattern to expose a top surface and a sidewall of the first floating body pattern.

The method may further include forming gate spacers covering sidewalls of the first gate pattern and extending over sidewalls of the protrusion portion of the first floating body pattern before forming the first impurity regions.

The method may further include forming first gate spacers covering sidewalls of the first gate pattern before forming the partially etched regions. Here, the first gate spacers and the first gate pattern may be used as etch masks to partially etch the first floating body pattern.

Moreover, the method may further include forming second gate spacers covering the first gate spacers and extending over sidewalls of the protrusion portion of the first floating body pattern before forming the first impurity regions.

The protrusion portion of the first floating body pattern may have a greater width than the gate pattern. The protrusion portion of the first floating body pattern may be formed to have a smaller width than a distance between facing sidewalls of adjacent first impurity regions. The protrusion portion may be formed not to overlap the first impurity regions.

The first floating body pattern disposed between the first impurity regions and at a lower part of the first gate pattern may be a charge storage region of a DRAM cell.

The first floating body pattern may include at least two regions of different characteristics, an upper region of which may be disposed in the protrusion portion of the first floating body pattern. Partially etching the first floating body pattern may include removing the upper region of the at least two regions from both sides of the first gate pattern to form the recessed regions. The recessed regions may be formed to have different characteristics than the protrusion portion.

BRIEF DESCRIPTION OF THE DRAWINGS

The above and other features and advantages will become more apparent to those of ordinary skill in the art by describing in detail exemplary embodiments with reference to the attached drawings, in which:

FIGS. 2A to 9B illustrate cross-sectional views of stages in a method of forming a semiconductor device according to example embodiments.

DETAILED DESCRIPTION

Figure 1:
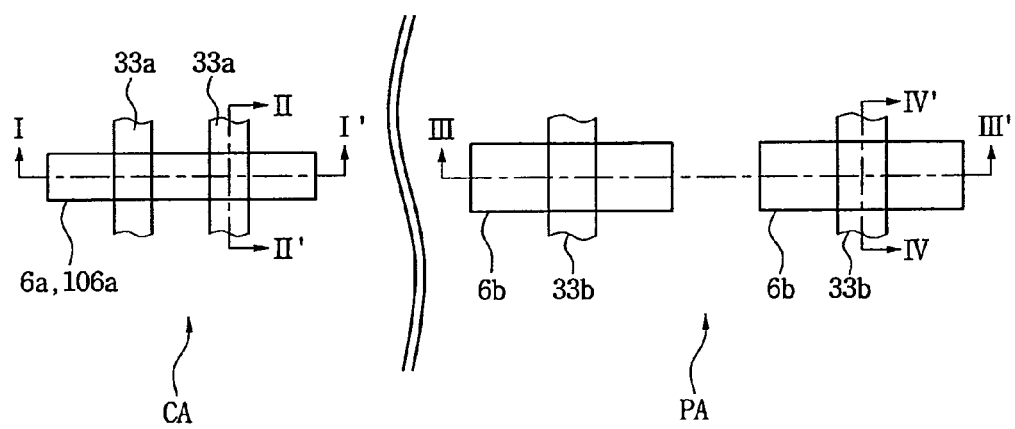
FIG. 1 illustrates a plan view of example embodiments.

Korean Patent Application No. 10-2008-0129318, filed on Dec. 18, 2008, in the Korean Intellectual Property Office, and entitled: "Methods of Fabricating Semiconductor Device Having Capacitorless One-Transistor Memory Cell," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure is thorough and complete and fully conveys the scope of the inventive concept to one skilled in the art. In the drawings, the dimensions of layers and regions may be exaggerated for clarity of illustration. It will also be understood that when a layer is referred to as being "on" or "under" another layer or substrate, it can be directly on or under the other layer or substrate, or intervening layers may also be present. In addition, it will also be understood that when a layer is referred to as being "between" two layers, it can be the only layer between the two layers, or one or more intervening layers may also be present. Throughout the drawings, like elements are denoted by like reference numerals.

FIG. 1 illustrates a plan view of example embodiments, FIGS. 2A to 9B illustrate cross-sectional views of stages in a method of forming a semiconductor device according to example embodiments, and FIGS. 10A to 13B illustrate cross-sectional views of stages in a method of forming a semiconductor device according to other example embodiments. In FIG. 1, "CA" denotes a memory cell array region, and "PA" denotes a peripheral circuit region. In FIGS. 2A, 3A, 4A, 5A, 6A, 7A, 8A, 9A, 10A, 11A, 12A and 13A, "A" is a region taken along line I-I' of FIG. 1, and "B" is a region taken along line II-II' of FIG. 1. In FIGS. 2B, 3B, 4B, 5B, 6B, 7B, 8B, 9B, 10B, 11B, 12B and 13B, "C" is a region taken along line III-III' of FIG. 1, and "D" is a region taken along line IV-IV' of FIG. 1.

First, methods of fabricating a semiconductor device according to example embodiments will be described below with reference to FIGS. 1 and 2A-9B.

Figure 2A:
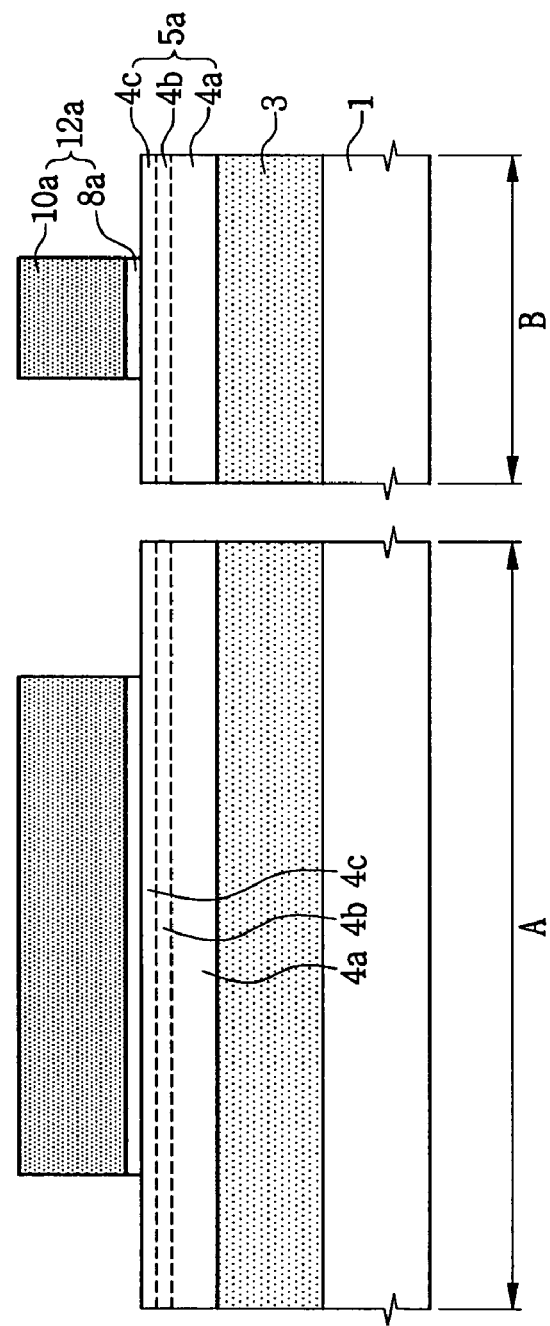

Referring to FIGS. 1, 2A, and 2B, floating body layers 5a and 5b may be formed on a lower insulating layer 3 of a substrate 1. The floating body layers 5a and 5b may be formed using various techniques, e.g., a method of forming a Silicon-On-Insulator (SOI) or Silicon On Oxide-Nitride-Oxide (SOONO) substrate.

The substrate 1 including the floating body layers 5a and 5b may include a cell array region CA and a peripheral circuit region PA. The floating body layer 5a may be referred to as a cell floating body layer 5a in the cell array region CA, and the floating body layer 5b may be referred to as a peripheral floating body layer 5b in the peripheral circuit region PA. Well ions and/or channel ions may be implanted into the cell floating body layer 5a.

In some example embodiments, impurities may be implanted into the cell floating body layer 5a in the cell array region CA to form a plurality of regions. For example, as illustrated in FIG. 2A, the cell floating body layer 5a may be formed to include a lower region 4a and an upper region 4c above the lower region 4a. The upper region 4c may include the same conductivity type impurities as the lower region 4a. Further, the upper region 4c may be formed to have a higher impurity concentration than the lower region 4a.

As further illustrated in FIG. 2A, an intermediate region 4b may be formed between the lower region 4a and the upper region 4c. The lower and upper regions 4a and 4c may have a different conductivity type from the intermediate region 4b. For example, the lower and upper regions 4a and 4c may have a p-type conductivity, and the intermediate region 4b may have an n-type conductivity.

In other example embodiments, the cell floating body layer 5a may be formed to include a cell semiconductor region 4a, a tunnel insulating layer 4b, and a charge storage region 4c, which are sequentially stacked. That is, the lower region 4a may be formed as a cell semiconductor region, the intermediate region 4b may be formed as a tunnel insulating layer, and the upper region 4c may be formed as a charge storage region. The upper region, i.e., the charge storage region 4a, may be a conductor capable of storing charge or a dielectric material capable of trapping charge and storing it.

A cell hard mask 12a may be formed on the cell floating body layer 5a, and a peripheral hard mask 12b may be formed on the peripheral floating body layer 5b. The cell and peripheral hard masks 12a and 12b may include thermal oxide layers 8a and 8b, respectively, and silicon nitride layers 10a and 10b, respectively. The thermal oxide layers and silicon nitride layers may be sequentially stacked on the floating body layers.

Figure 3A:
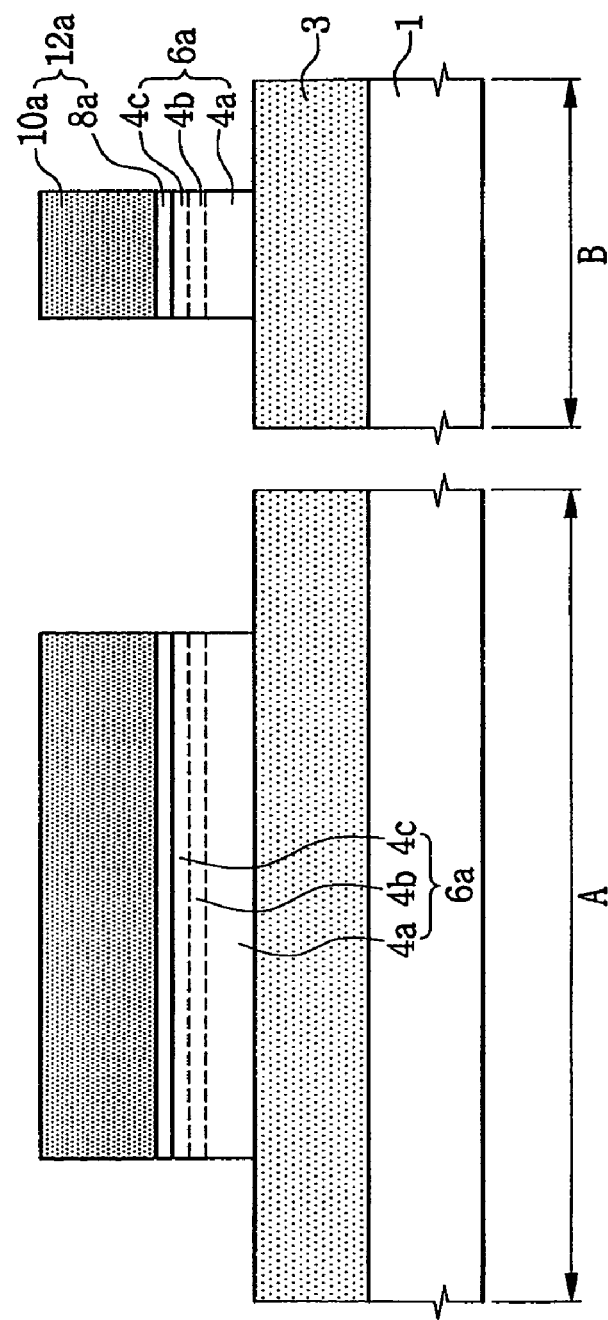
Figure 3B:
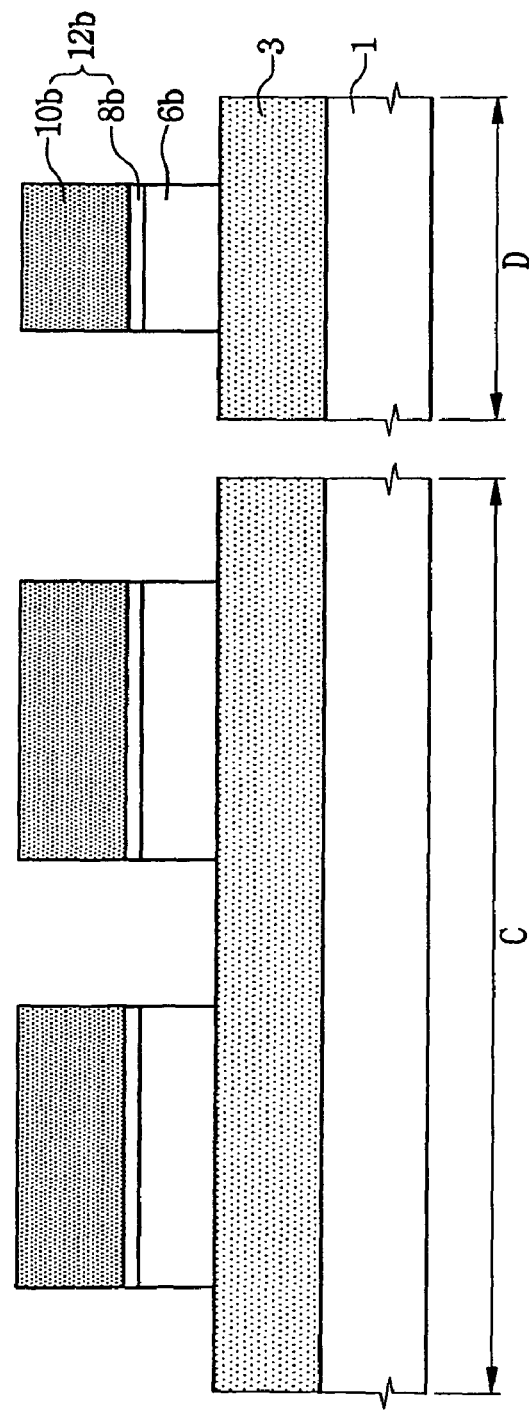

Referring to FIGS. 1, 3A, and 3B, the cell and peripheral floating body layers 5a and 5b of FIGS. 2A and 2B may be etched using the cell and peripheral hard masks 12a and 12b as etch masks, respectively, to form floating body patterns, i.e., a cell floating body pattern 6a in the cell array region CA and a peripheral floating body pattern 6b in the peripheral circuit region PA. Therefore, the cell floating body pattern 6a and the cell hard mask 12a, which are sequentially formed, may be on the lower insulating layer 3 of the cell array region CA, and the peripheral floating body pattern 6b and the peripheral hard mask 12b, which are sequentially stacked, may be on the lower insulating layer 3 of the peripheral circuit region PA.

Figure 4A:
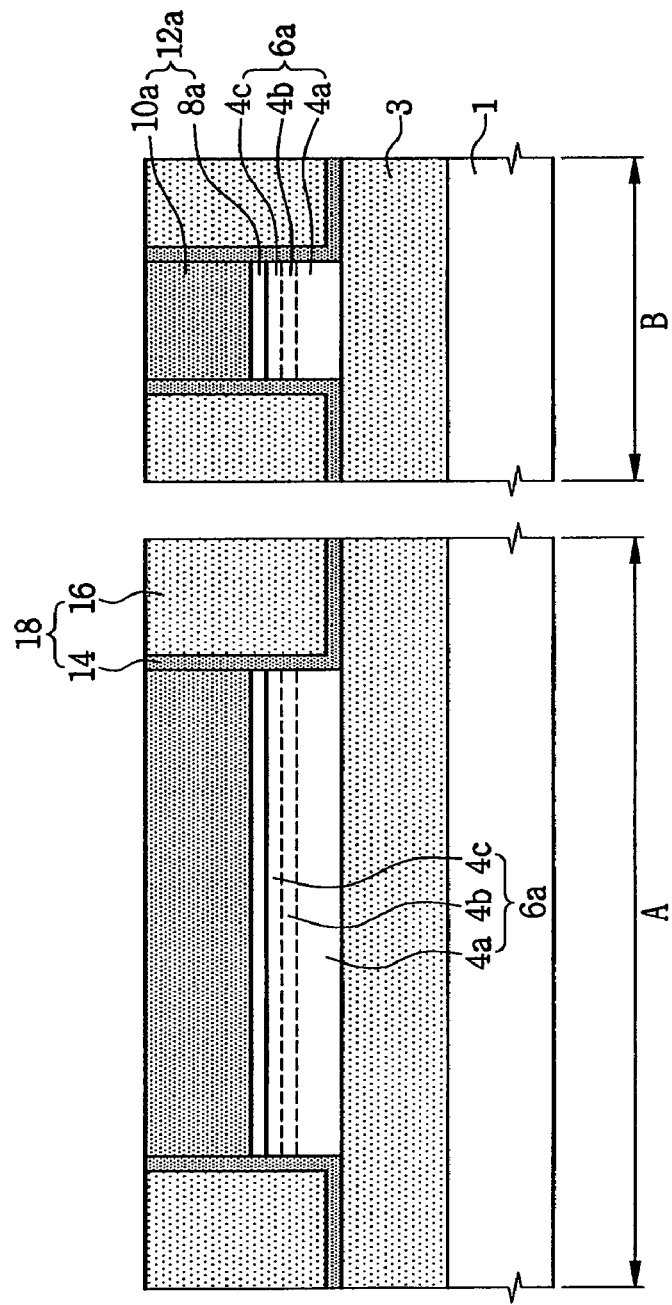

Referring to FIGS. 1, 4A, and 4B, an isolation layer 18 surrounding sidewalls of the cell and peripheral floating body patterns 6a and 6b and sidewalls of the cell and peripheral hard masks 12a and 12b may be formed. The isolation layer 18 may include an insulating liner 14 and an isolation insulating layer 16 on the insulating liner 14. The insulating liner 14 may cover, e.g., overlap, both a sidewall and a bottom surface of the isolation insulating layer 16. The insulating liner 14 may be formed of a material having an etch selectivity with respect to the isolation insulating layer 16. For example, the insulating liner 14 may include a silicon nitride layer, and the isolation insulating layer 16 may include a silicon oxide layer.

Figure 5A:
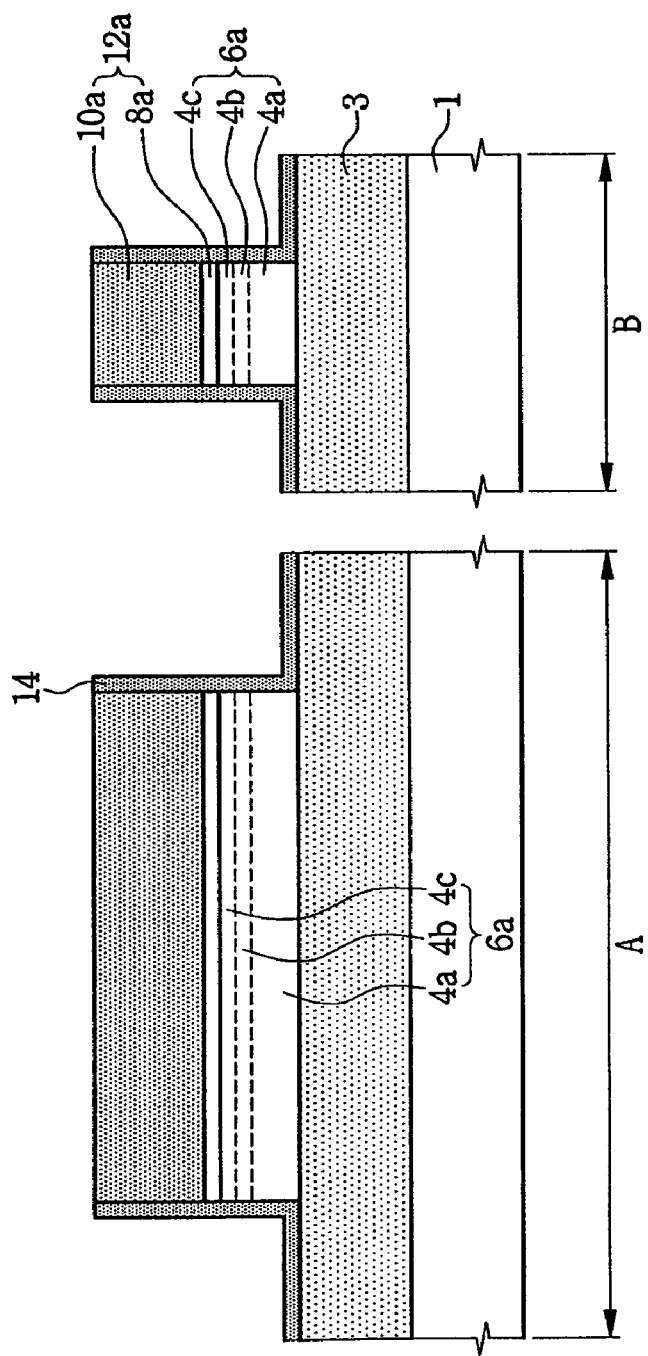
Figure 5B:
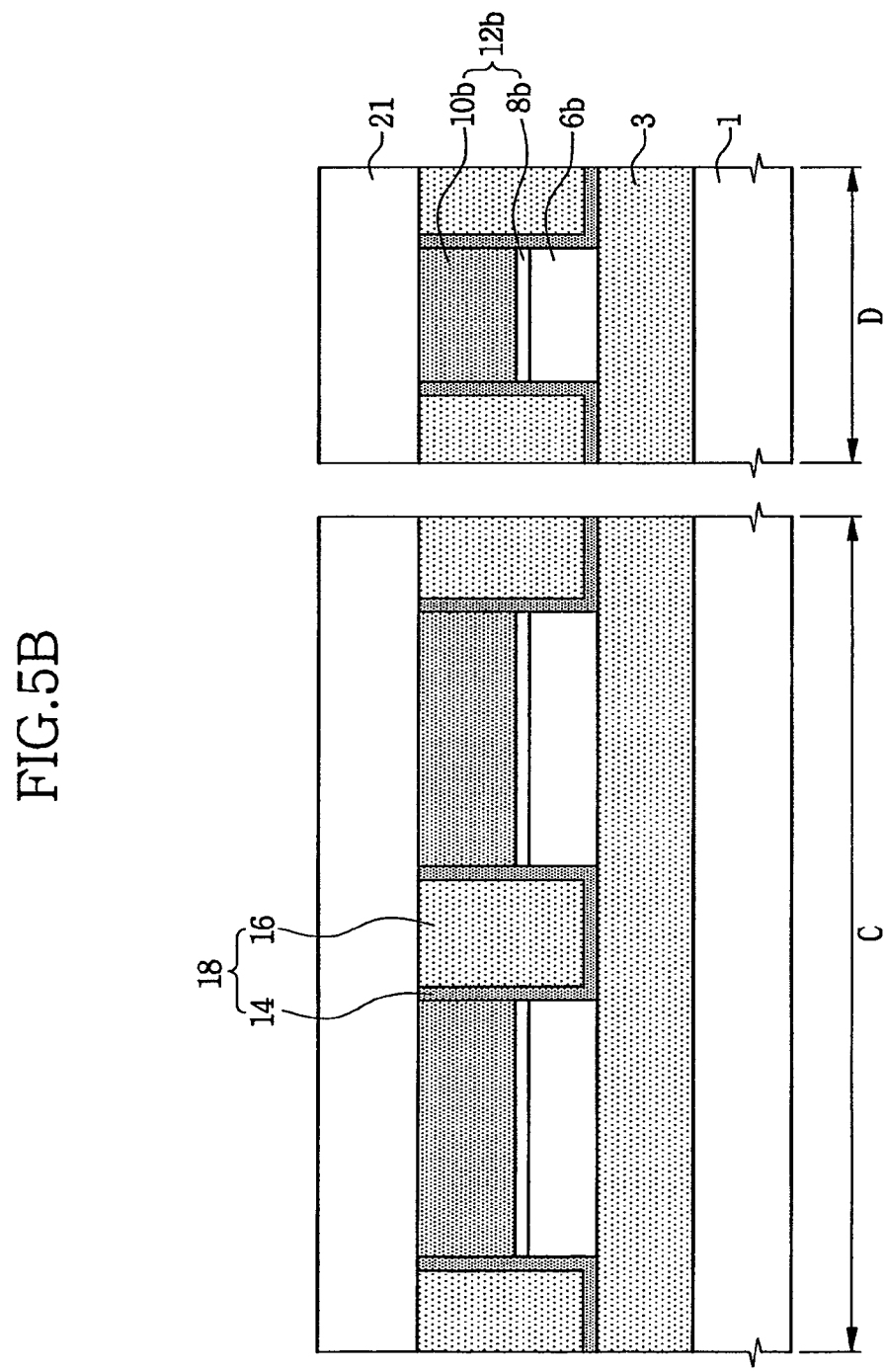

Referring to FIGS. 1, 5A, and 5B, a mask pattern 21 covering the peripheral circuit region PA of the substrate a having the isolation layer 18 may be formed. The mask pattern 21 may be formed of a photoresist layer.

The isolation insulating layer 16 of the cell array region CA may be etched using the mask pattern 21 as an etch mask, e.g., the isolation insulating layer 16 may be completely removed to expose the insulating liner 14. In such a case, the insulating liner 14 of the cell array region CA may serve as an etch stop layer capable of preventing the lower insulating layer 3 from being etched, e.g., the insulating liner 14 may cover exposed upper surfaces of the lower insulating layer 3.

Figure 6A:
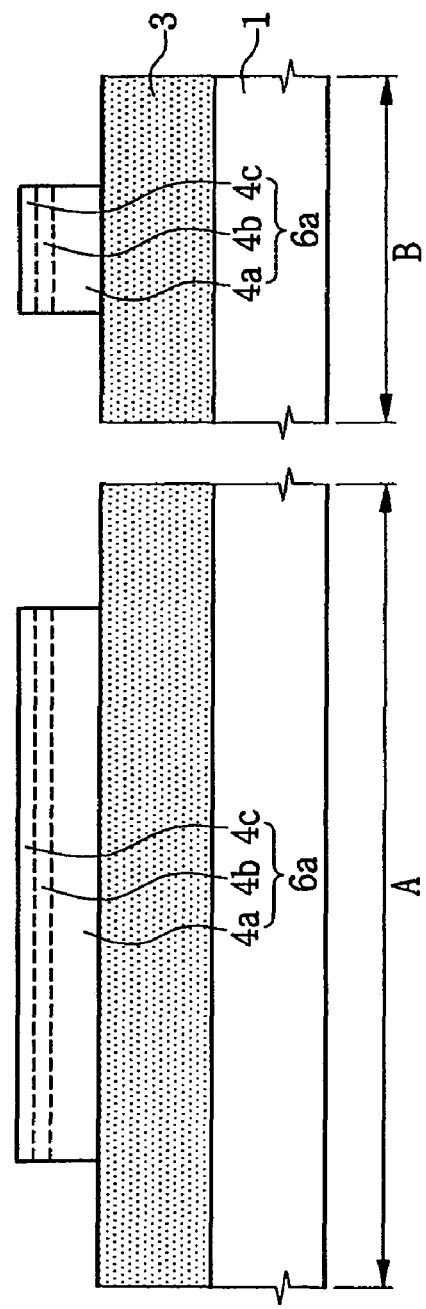

Referring to FIGS. 1, 6A, and 6B, the mask pattern 21 (FIG. 5B) may be removed from the peripheral circuit region PA. Afterwards, as illustrated in FIG. 6A, the cell hard mask 12a and the insulating liner 14 on the cell array region CA may be removed using an etching process to expose the cell floating body pattern 6a.

As illustrated in FIG. 6B, the peripheral hard mask 12b and the insulating liner 14 on the peripheral circuit region PA may be removed using an etching process as well. During removal of the peripheral hard mask 12b and the insulating liner 14 from the peripheral circuit region PA, a part of the isolation layer 18 on the peripheral circuit region PA may be etched to form a peripheral isolation layer 18a. In other words, a top surface of the isolation layer 18 in the peripheral circuit region PA may be lowered. The peripheral isolation layer 18a may include a peripheral insulating liner 14a and a peripheral isolation insulating layer 16a.

A top surface of the peripheral isolation layer 18a may be disposed substantially at the same level as that of the peripheral floating body pattern 6b. Alternatively, a top surface of the peripheral isolation layer 18a may be disposed at a higher level than that of the peripheral floating body pattern 6b.

Figure 7A:
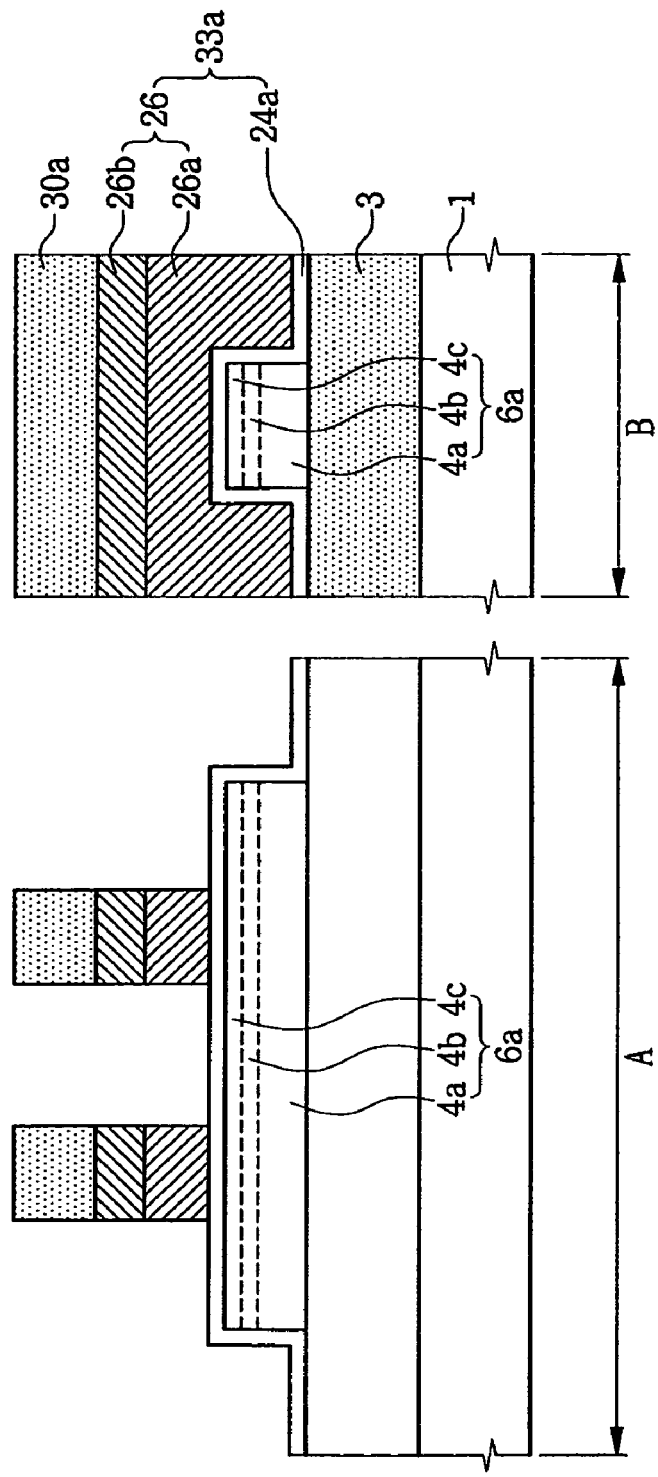

Referring to FIGS. 1, 7A, and 7B, a cell gate dielectric layer 24a may be formed, e.g., conformally, on the cell floating body pattern 6a and may cover an upper surface of the lower insulation layer 3. A peripheral gate dielectric layer 24b may be formed on the peripheral floating body pattern 6b and may cover an upper surface of the peripheral isolation layer 18a. The cell gate dielectric layer 24a may include, e.g., at least one of a silicon oxide layer and a high-k dielectric layer. The peripheral gate dielectric layer 24b may include, e.g., at least one of a silicon oxide layer and a high-k dielectric layer.

A gate conductive layer (not shown) may be formed on the substrate having the cell and peripheral gate dielectric layers 24a and 24b. Forming the gate conductive layer may include forming a lower gate conductive layer on the substrate having the cell and peripheral gate dielectric layers 24a and 24b, and forming an upper gate conductive layer on the lower gate conductive layer. The lower gate conductive layer may be formed, e.g., of a planarized polysilicon layer, and the upper gate conductive layer may be formed, e.g., of a metal layer and/or a metal silicide layer.

As illustrated in FIGS. 7A and 7B, a cell gate mask 30a may be formed on the gate conductive layer of the cell array region CA, and a peripheral gate mask 30b may be formed on the gate conductive layer of the peripheral circuit region PA. The gate conductive layer may be etched using the cell and peripheral gate masks 30a and 30b as etch masks to form a cell gate electrode 26 in the cell array region CA, and to form a peripheral gate electrode 28 in the peripheral circuit region PA. The cell gate electrode 26 may include a lower cell gate electrode 26a and an upper cell gate electrode 26b, which are sequentially stacked. The peripheral gate electrode 28 may include a lower peripheral gate electrode 28a and an upper peripheral gate electrode 28b, which are sequentially stacked.

Therefore, the first gate pattern, i.e., a cell gate pattern 33a, crossing over the cell floating body pattern 6a and covering sidewalls of the cell floating body pattern 6a may be formed. In other words, the cell gate pattern 33a may be positioned substantially perpendicularly with respect to the cell floating body pattern 6a, such that the cell gate pattern 33a may overlap a top surface and sidewalls of the cell floating body pattern 6a, e.g., the cell gate pattern 33a may have an inverted-U cross-section to overlap portions of the top surface and sidewalls of the cell floating body pattern 6a. Also, the second gate pattern, i.e., a peripheral gate pattern 33b, crossing over the peripheral floating body pattern 6b may be formed. The cell gate pattern 33a may include the cell gate dielectric layer 24a and the cell gate electrode 26, which are sequentially stacked, and the peripheral gate pattern 33b may include the peripheral gate dielectric layer 24b and the peripheral gate electrode 28, which are sequentially stacked.

Figure 8A:
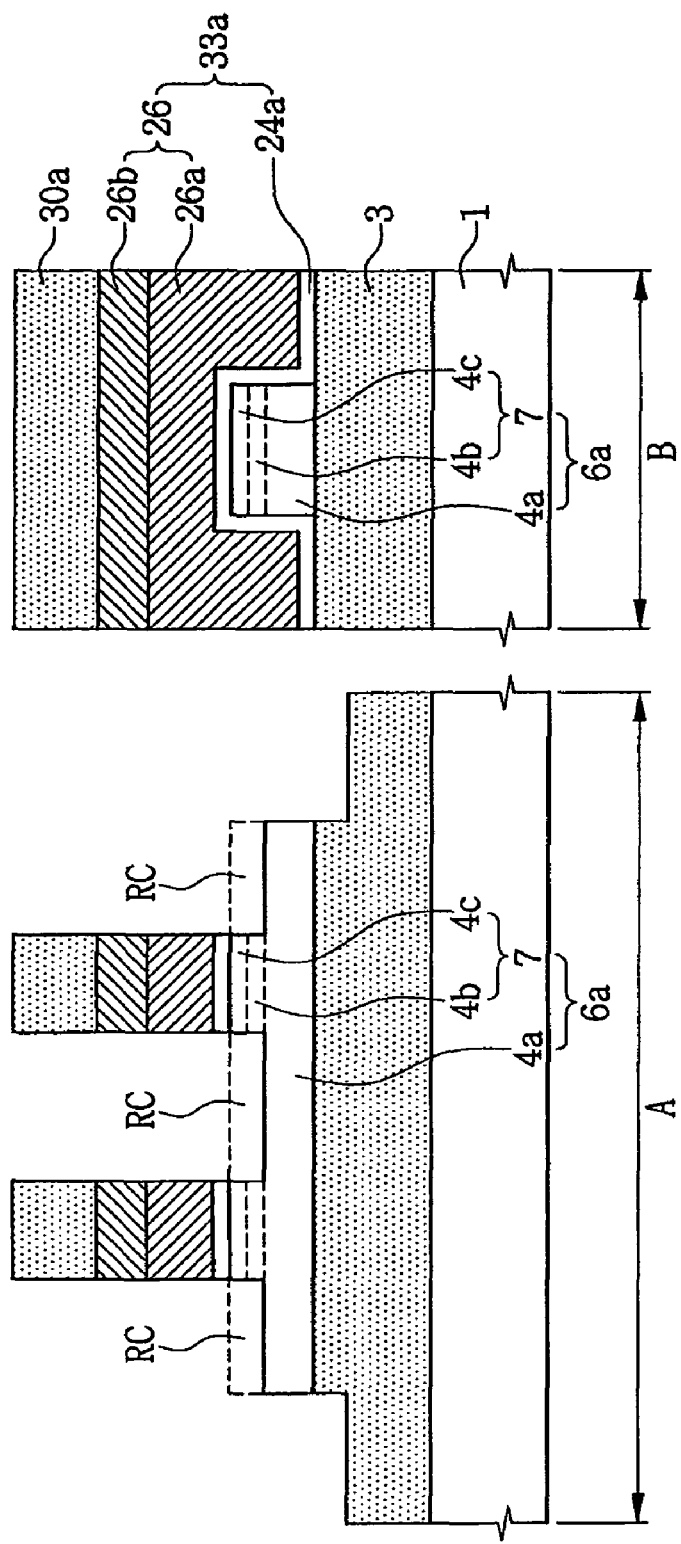
Figure 8B:
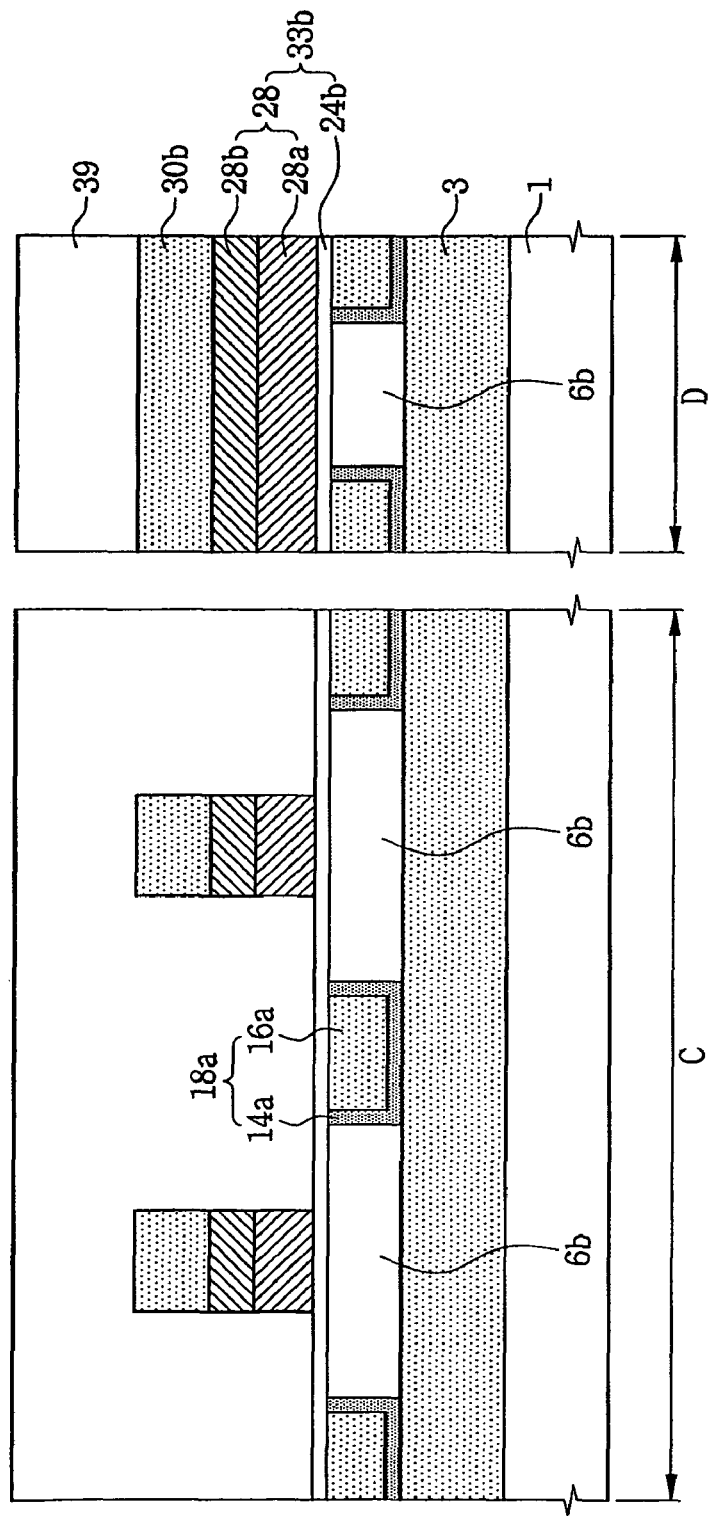

Referring to FIGS. 1, 8A, and 8B, a photoresist pattern 39 covering the peripheral circuit region PA may be formed. Afterwards, the photoresist pattern 39, and the cell gate pattern 33a and the cell gate mask 30a, which are sequentially stacked in the cell array region CA, may be used as etch masks to partially etch the cell floating body pattern 6a, so that partially etched regions, i.e., recessed regions RC, may be formed in the cell floating body pattern 6a. For example, upper portions of the cell floating body pattern 6a may be removed between cell gate patterns 33a, e.g., portions of the cell floating body pattern 6a on each side of the cell gate patterns 33a may be partially removed, so a portion of the cell floating body pattern 6a under the cell gate pattern 33a may remain unetched. For example, as illustrated in FIG. 8A, a recessed region RC may be formed on each side of the cell gate pattern 33a, such that a protrusion portion 7 may be defined in the cell floating body pattern 6a under the cell gate patterns 33a, e.g., the protrusion portion 7 and cell gate pattern 33a may completely overlap each other. A top surface of the protrusion portion 7 may extend above top surfaces of the recessed regions RC with respect to a reference point on the substrate 1.

As upper portions of the cell floating body pattern 6a are removed to form the recessed regions RC, the lower regions 4a of the cell floating body pattern 6a may be exposed between adjacent cell gate patterns 33a in the recessed regions RC. The protrusion portions 7, however, may include the lower, intermediate, and upper regions 4a through 4c. The protrusion portions 7, including the intermediate and upper regions 4b and 4c, may protrude from the lower region 4a between the recessed regions RC. In other words, the cell floating body pattern 6a between the recessed regions RC may have the protrusion portion 7 extending to a higher level than the recessed regions RC. The protrusion portion 7 may have substantially the same width as the cell gate pattern 33a. The protrusion portion 7 may include a part of the lower region 4a, as well as the upper and intermediate regions 4c and 4b. As illustrated in FIG. 8A, while the cell floating body pattern 6a is partially etched, the lower insulating layer 3 may be partially etched.

In some example embodiments, partially etching the cell floating body pattern 6a may be performed until the upper region 4c at both sides of the cell gate pattern 33a is etched, e.g., completely removed, and the intermediate region 4b or the lower region 4a is exposed. For example, when the intermediate region 4b has a different conductivity type from the upper and intermediate regions 4c and 4a, the upper region 4c and the intermediate region 4b at both sides of the cell gate pattern 33a may be sequentially etched until the lower region 4a is exposed. Alternatively, when the intermediate region 4b is formed of a tunnel insulating layer, partially etching the cell floating body pattern 6a may be performed until the intermediate region 4b or the lower region 4a at both sides of the cell gate pattern 33a is exposed. It is noted that while it is described that an etching process is performed until the lower region 4a at both sides of the cell gate pattern 33a is exposed during the partial etching process of the cell floating body pattern 6a, the partial etching process may include etching a part of the lower region 4a.

Figure 9A:
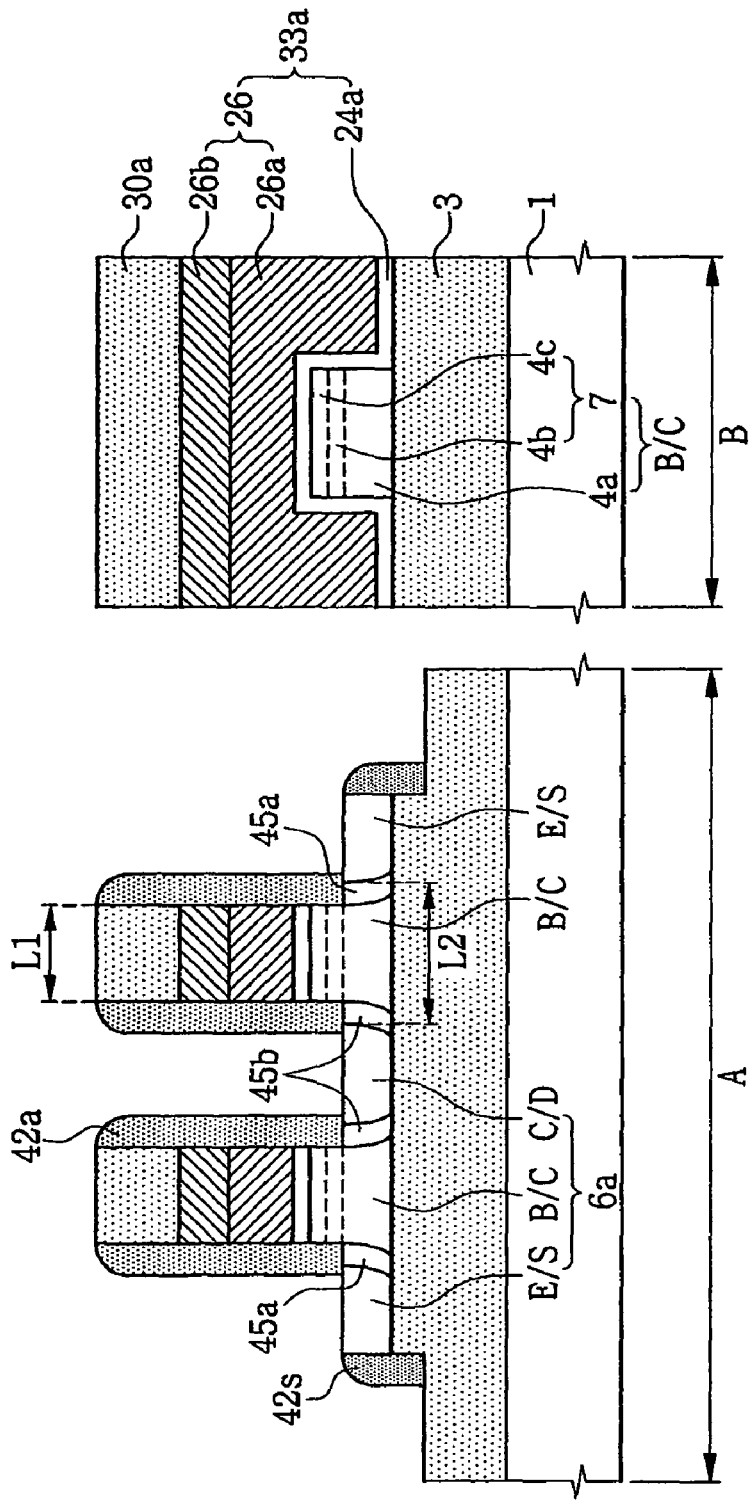

Referring to FIGS. 1, 9A, and 9B, the photoresist pattern 39 of FIG. 8B may be removed to form a spacer insulating layer (not shown) on a resultant structure. Afterwards, the spacer insulating layer may be anisotropically etched to form spacers 42a and 42s in the cell region CA, as illustrated in FIG. 9A, and spacer 42b in the peripheral circuit region PA, as illustrated in FIG. 9B. The spacers 42a, 42s, and 42b may include a cell gate spacer 42a formed on sidewalls of the cell gate pattern 33a and the cell gate mask 30a, which are sequentially stacked, a sidewall spacer 42s formed on sidewalls of the floating body pattern 6a, and a peripheral gate spacer 42b formed on sidewalls of the peripheral gate pattern 33b and the peripheral gate mask 30b, which are sequentially stacked. The cell gate spacer 42a may cover the sidewalls of the cell gate pattern 33a and the cell gate mask 30a, and may extend over sidewalls of the protrusion portion 7 of the cell floating body pattern 6a.

As illustrated in FIG. 9B, a first peripheral impurity region PS and a second peripheral impurity region PD may be formed within the peripheral floating body pattern 6b at both sides of the peripheral gate pattern 33b. The peripheral floating body pattern 6b region between the first and second peripheral impurity regions PS and PD may be defined as a channel region PC. Therefore, a MOS transistor having reliability may be formed in the peripheral circuit region PA.

As illustrated in FIG. 9A, a first cell impurity region E/S and a second cell impurity region C/D may be formed within the cell floating body pattern 6a at both sides of the cell gate pattern 33a. In other words, the first cell impurity region E/S and second cell impurity region C/D may be formed in the recessed regions RC of the cell floating body pattern 6a. During the MOSFET operation of the cell array region CA, the first cell impurity region E/S may be referred to as a source, the second cell impurity region C/D may be referred to as a drain, and the cell floating body pattern 6a region between the first and second impurity regions E/S and C/D, i.e., including the protrusion portion 7, may be referred to as a channel region B/C. The source and the drain are not absolute, and thus may be changed. During the bipolar junction transistor (BJT) operation of the cell array region, the first cell impurity region E/S may be referred to as an emitter, the second cell impurity region C/D may be referred to as a collector, and the cell floating body pattern 6a region between the first and second impurity regions E/S and C/D may be referred to as a base B/C. The emitter and the collector are not absolute, and thus may be changed. The source/emitter E/S may be a node to which a low voltage is applied, and the drain/collector C/D may be a node to which a high voltage is applied. In the example embodiments, a BJT may be used not only to read and refresh a memory cell, but also to program and write it.

The channel region or the base in the cell floating body pattern 6a (hereinafter, it is referred to as a base B/C for convenience) may include the lower region 4a, the intermediate region 4b, and the upper region 4c described in FIG. 2A. As described in FIG. 2A, when the intermediate region 4b has a different conductivity type from the lower and upper regions 4a and 4c, it may have increased resistance to charge leakage in a capacitorless one-transistor DRAM cell. Moreover, when the upper region 4c has a higher impurity concentration than the lower region 4a, a charge storage capability may be improved. Further, when the intermediate region 4b is formed of a tunnel insulating layer, the upper region 4c may be a conductor capable of storing charges or a dielectric material capable of trapping and storing charges. In such a case, a charge may be stored in the upper region 4c using F-N tunneling or hot carrier tunneling depending on an operation method of a capacitorless one-transistor DRAM cell.

In some example embodiments, as illustrated in FIG. 9A, the cell gate pattern 33a may have a width L1, e.g., as measured between facing sidewalls of adjacent cell gate spacers 42a. Therefore, the cell gate electrode 26b may have the width L1 in region A of FIG. 9A, i.e., along a direction of line I-I' in FIG. 1. The width L1 may be smaller than a distance L2, i.e., a distance between facing sidewalls of the first and second impurity regions E/S and C/D measured along a same direction as the width L1. The cell gate pattern 33a may be positioned to not overlap at least one of the first and second cell impurity regions E/S and C/D, e.g., the entire cell gate pattern 33a may overlap a region between facing sidewalls of the first and second impurity regions E/S and C/D. For example, the distance L2 may completely overlap the cell gate pattern 33a, so the cell gate pattern 33a may not overlap either of the first and second impurity regions E/S and C/D. Therefore, in the capacitorless one-transistor DRAM cell, a gate capacitance between the gate pattern 26 and the base B/C may be reduced in proportion to a drain capacitance or a source capacitance, and thus a sensing margin may be increased, and gate induced drain leakage (GIDL) current may be reduced.

In other example embodiments, the first impurity cell region E/S defined as an emitter may have a higher impurity concentration than the second impurity region C/D defined as a collector.

In still other example embodiments, a first buffer region 45a may be formed between the first impurity region E/S and the base B/C. While the first buffer region 45a has the same conductivity type as the base B/C, it may have a different impurity concentration from the base B/C. For example, the first buffer region 45a may have a lower impurity concentration than the base B/C. The first buffer region 45a may increase electron injection efficiency from the first impurity region E/S, i.e., an emitter, to the base B/C in the capacitorless one-transistor DRAM cell.

In yet other example embodiments, a second buffer region 45b may be formed between the second impurity region C/D and the base B/C. The second buffer region 45b may have the same conductivity type as the second impurity region C/D. Alternatively, the second buffer region 45b may have the same conductivity type as the base B/C. The second buffer region 45b may have a lower impurity concentration than the second impurity region C/D and/or the base B/C. Therefore, the second buffer region 45b may serve to increase mean free paths of electrons from the base B/C to the second impurity region C/D, i.e., collector, in the capacitorless one-transistor DRAM cell. That is, impact ionization for avalanche generation may be improved, and thus more charge may be stored.

The cell gate pattern 33a may overlap at least one of the first and second buffer regions 45a and 45b. Alternatively, the cell gate pattern 33a may be formed on the base B/C without overlapping the first and/or second buffer regions 45a and 45b.

A method of fabricating a semiconductor device according to another example embodiment will be described below with reference to FIGS. 1 and 10A-13B.

Figure 10B:
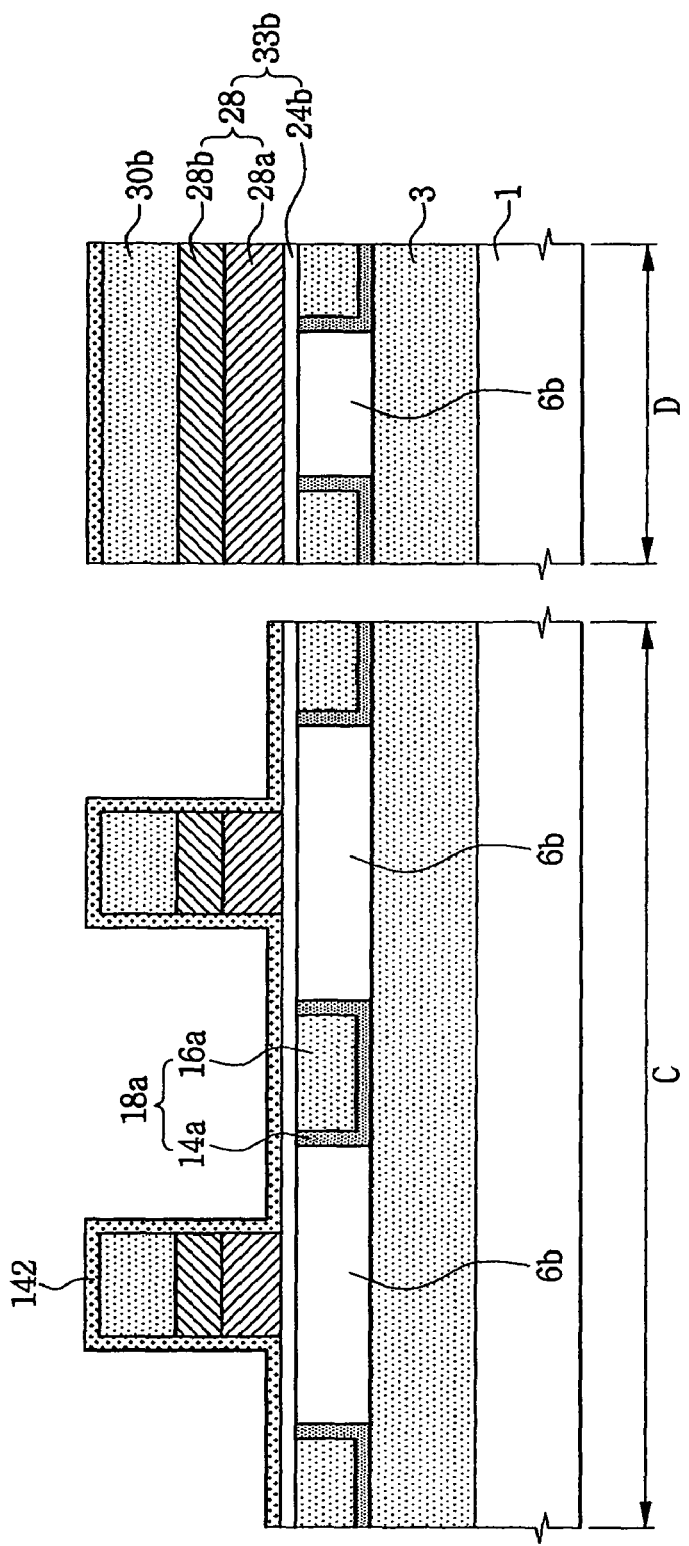
FIGS. 10A to 13B illustrate cross-sectional views of stages in a method of forming a semiconductor device according to other example embodiments.

Referring to FIGS. 1, 10A, and 10B, the substrate 1 with the gate patterns 33a and 33b may be formed by a method described previously with reference to FIGS. 2A to 7B. That is, the cell and peripheral gate patterns 33a and 33b of FIGS. 7A and 7B may be formed in the substrate 1. A first spacer insulating layer 142 may be formed on the substrate 1, e.g., conformally on the gate patterns 33a and 33b. The first spacer insulating layer 142 may include, e.g., at least one of a silicon oxide layer, a silicon nitride layer, a silicon oxynitride layer, and an insulating carbon layer.

Figure 11A:
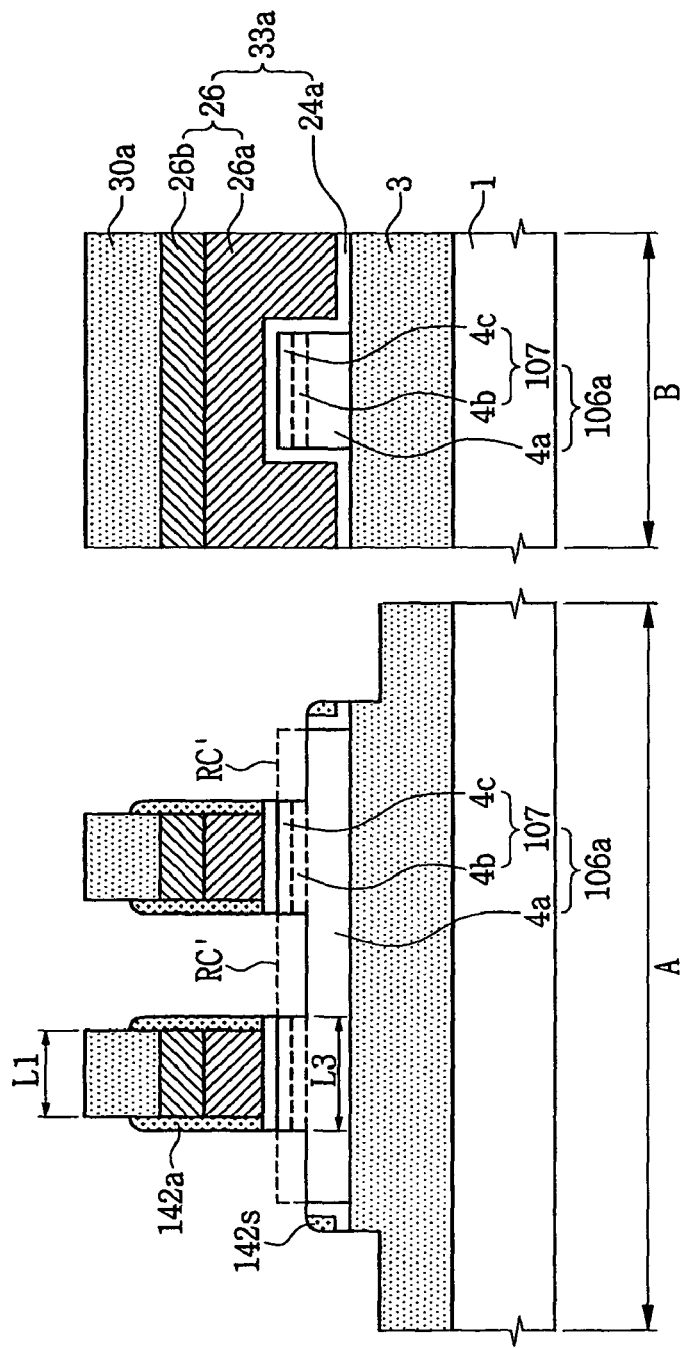
Figure 11B:
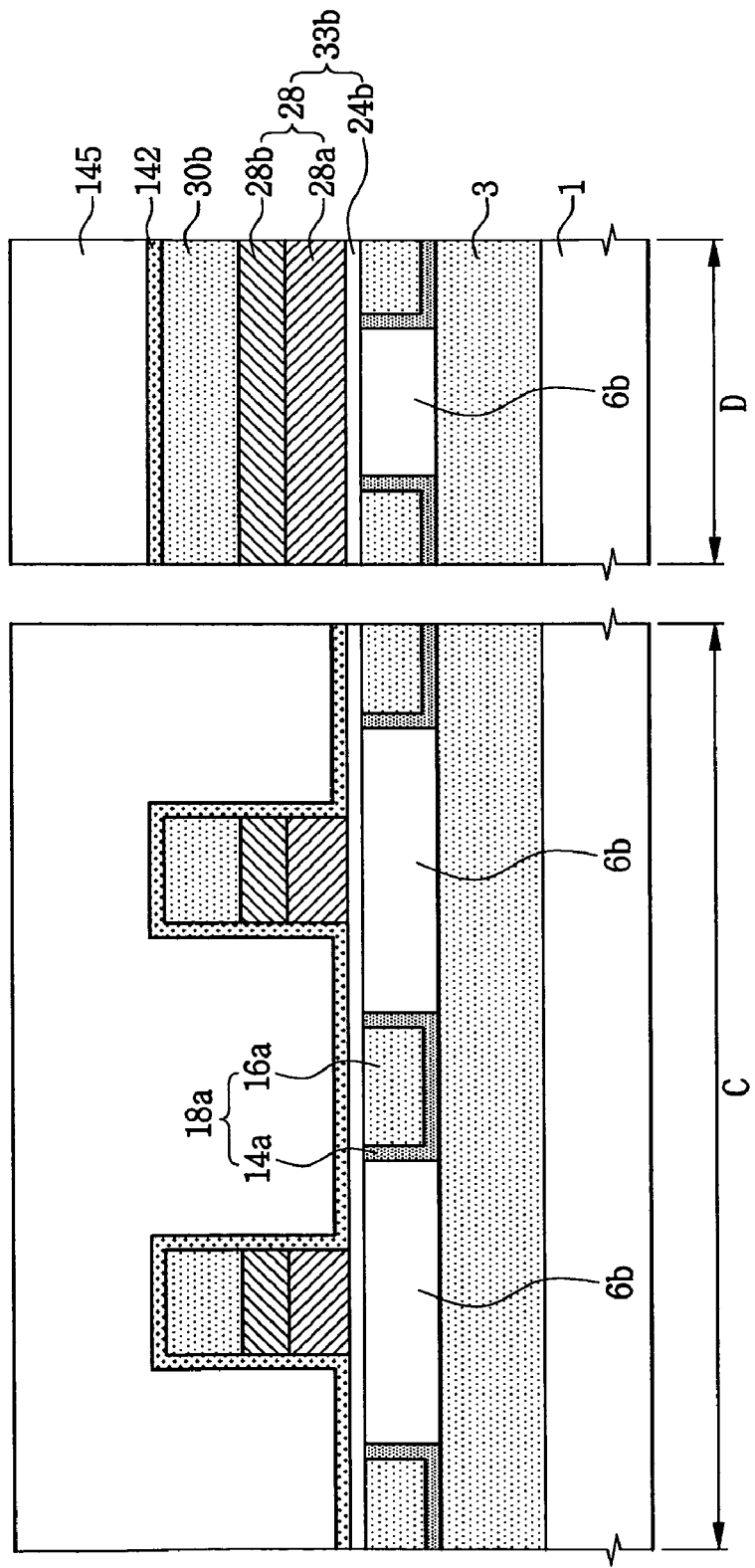

Referring to FIGS. 1, 11A, and 11B, a photoresist pattern 145 may be formed on the substrate 1 in the peripheral circuit region PA. The first spacer insulating layer 142 on the cell array region CA may be anisotropically etched using the photoresist pattern 145 as an etch mask to form a first cell gate spacer 142a on a sidewall of the cell gate pattern 33a, and to form a first sidewall spacer 142s on a sidewall of the cell floating body pattern 6a.

In another example embodiment, before forming the photoresist pattern 145, an anisotropic etching may be performed on the first spacer insulating layer 142, so that gate spacers may be formed on sidewalls of the cell and peripheral gate patterns 26 and 28.

Afterwards, the cell floating body pattern 6a may be partially etched using the photoresist pattern 145, the first cell gate spacer 142a, and the cell gate mask 30a as etch masks, so that partially etched regions, i.e., recessed regions RC', may be formed. The cell floating body pattern, in which the recessed regions RC' are formed, will be referred to hereinafter as 106a in order to distinguish from that described previously with reference to FIG. 9. The cell floating body pattern 106a between the recessed regions RC' may have a protrusion portion 107 more protruding than top surfaces of the recessed regions RC'. Further, the protrusion portion 107 may have a greater width than the cell gate pattern 33a. That is, the cell gate pattern 33a may have the first width L1, and the protrusion portion 107 may have a third width L3 greater than the first width L1. For example, the protrusion portion 107 may overlap the cell gate pattern 33a and the first cell gate spacers 142a thereon.

The protrusion portion 107 may include the upper region 4c and the intermediate region 4b. The protrusion portion 107 may include a part of the lower region 4a as well as the intermediate and upper regions 4b and 4c.

The shape of the first cell gate spacer 142a may be adjusted in accordance with a material of the first spacer insulating layer 142 and/or an etching process condition for forming the recessed regions RC'. For example, when the first spacer insulating layer 142 is formed of a silicon oxide layer-based insulating material layer, a height of the first cell gate spacer 142a may be lowered while an etching process for forming the recessed regions RC' is performed. While the etching process for forming the recessed regions RC' is performed, a portion covering a sidewall of a lower region of the gate electrode 26 of the first cell gate spacer 142a may not be etched. Therefore, the protrusion portion 107 of the cell floating body pattern 106a may have a width greater than the cell gate pattern 33a.

Figure 12A:
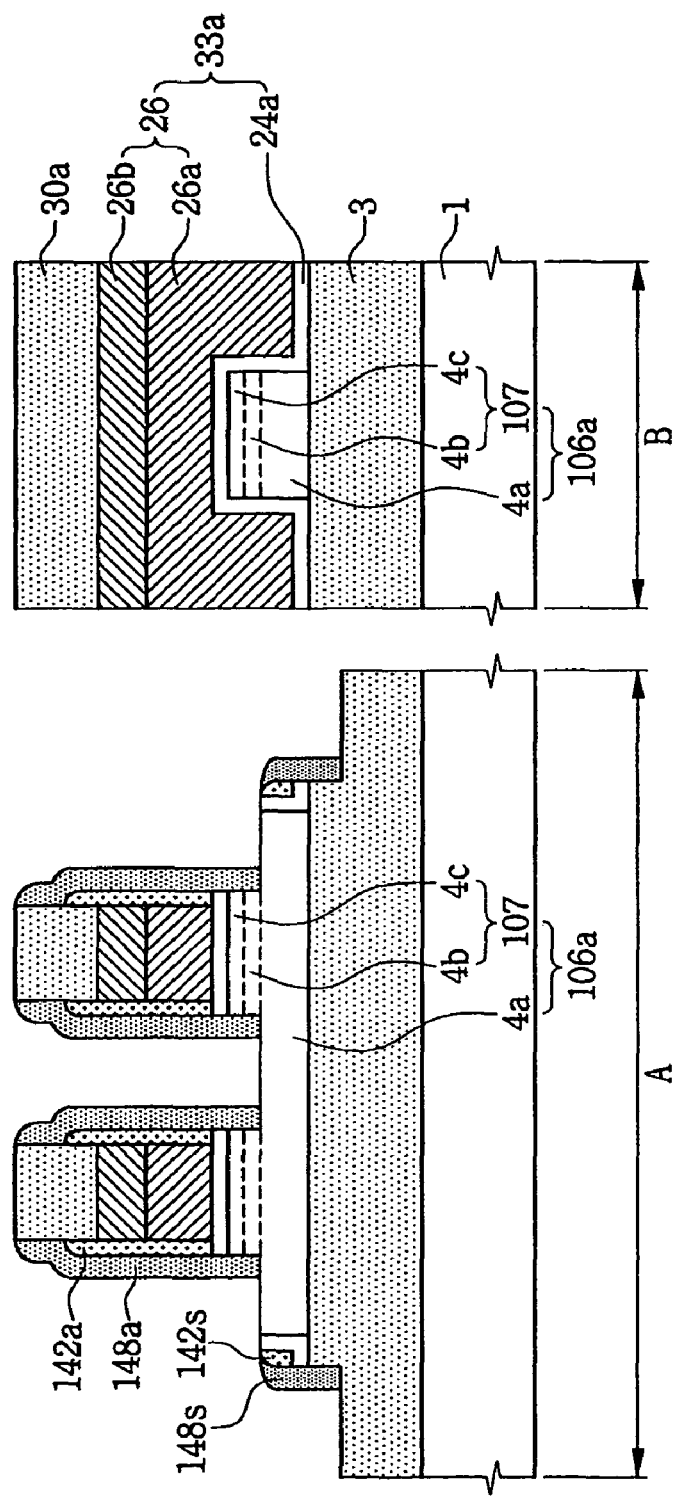
Figure 12B:
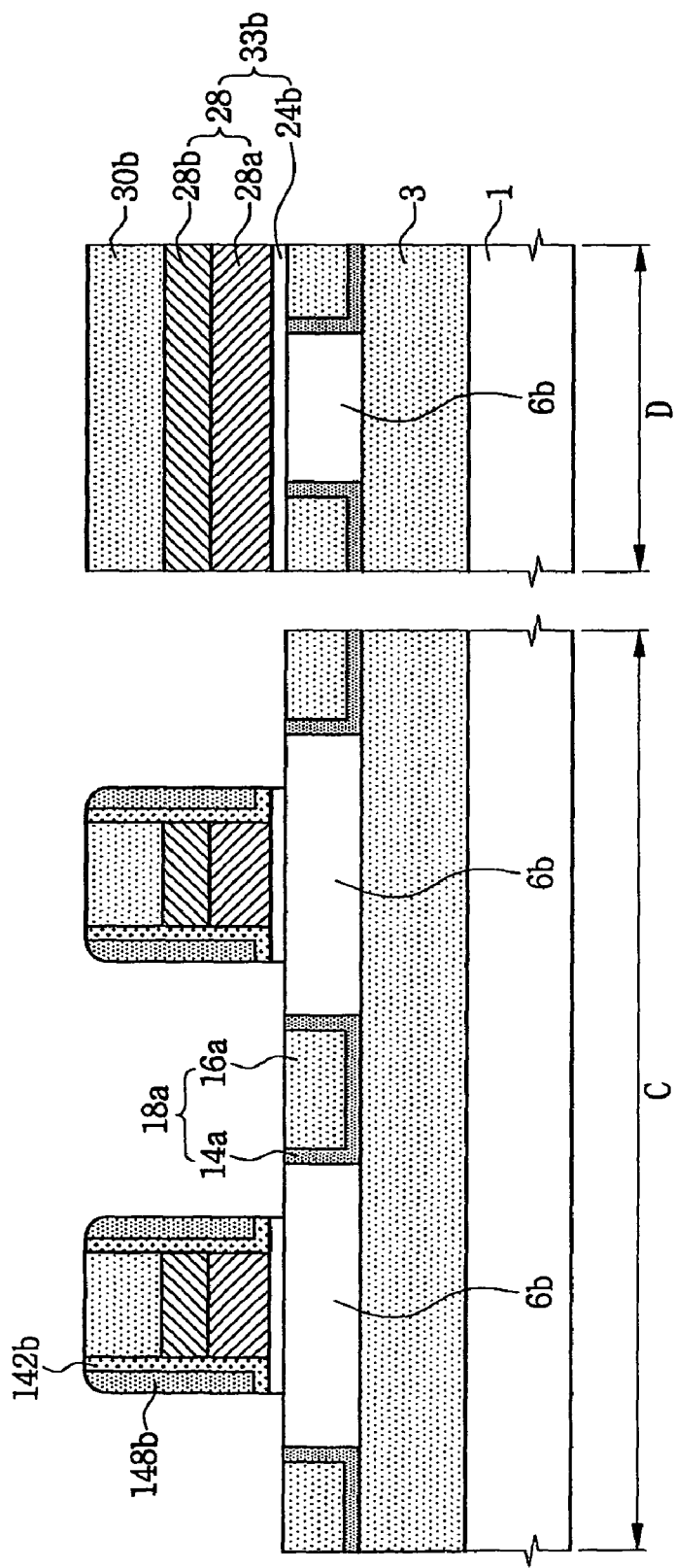

Referring to FIGS. 1, 12A, and 12B, the photoresist pattern 145 of FIG. 11B may be removed. Then, a second spacer insulating layer (not shown) may be formed on the entire surface of the substrate 1, from which the photoresist pattern 145 of FIG. 11B is removed. The second spacer insulating layer may be anisotropically etched to form a second cell gate spacer 148a covering the first cell gate spacer 142a. Further, as illustrated in FIG. 12B, a first peripheral gate spacer 142b and a second peripheral gate spacer 148b may be formed on a sidewall of the peripheral gate pattern 33b. Moreover, as illustrated in FIG. 12A, a second sidewall spacer 148s covering the first sidewall spacer 142s may be formed. The second sidewall spacer 148s may cover the first cell gate spacer 142a to extend over sidewalls of the protrusion portion 107 of the cell floating body pattern 106a.

Figure 13A:
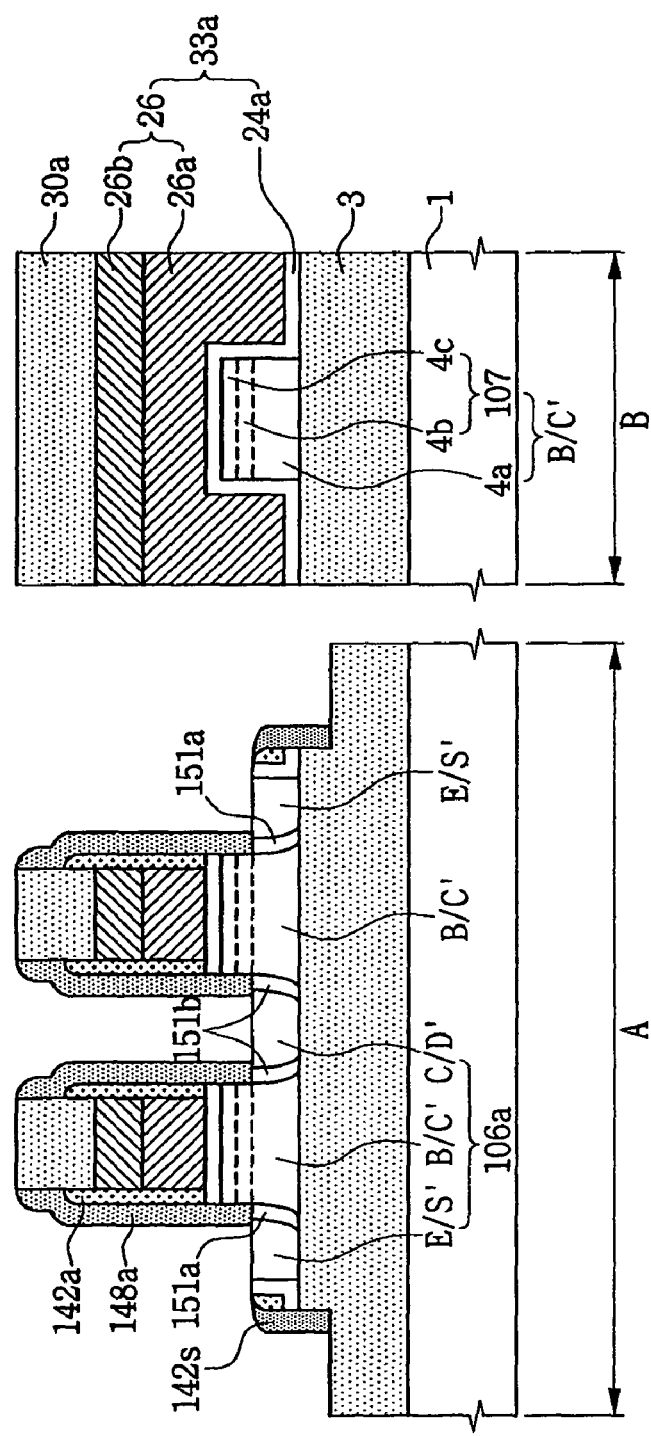
Figure 13B:
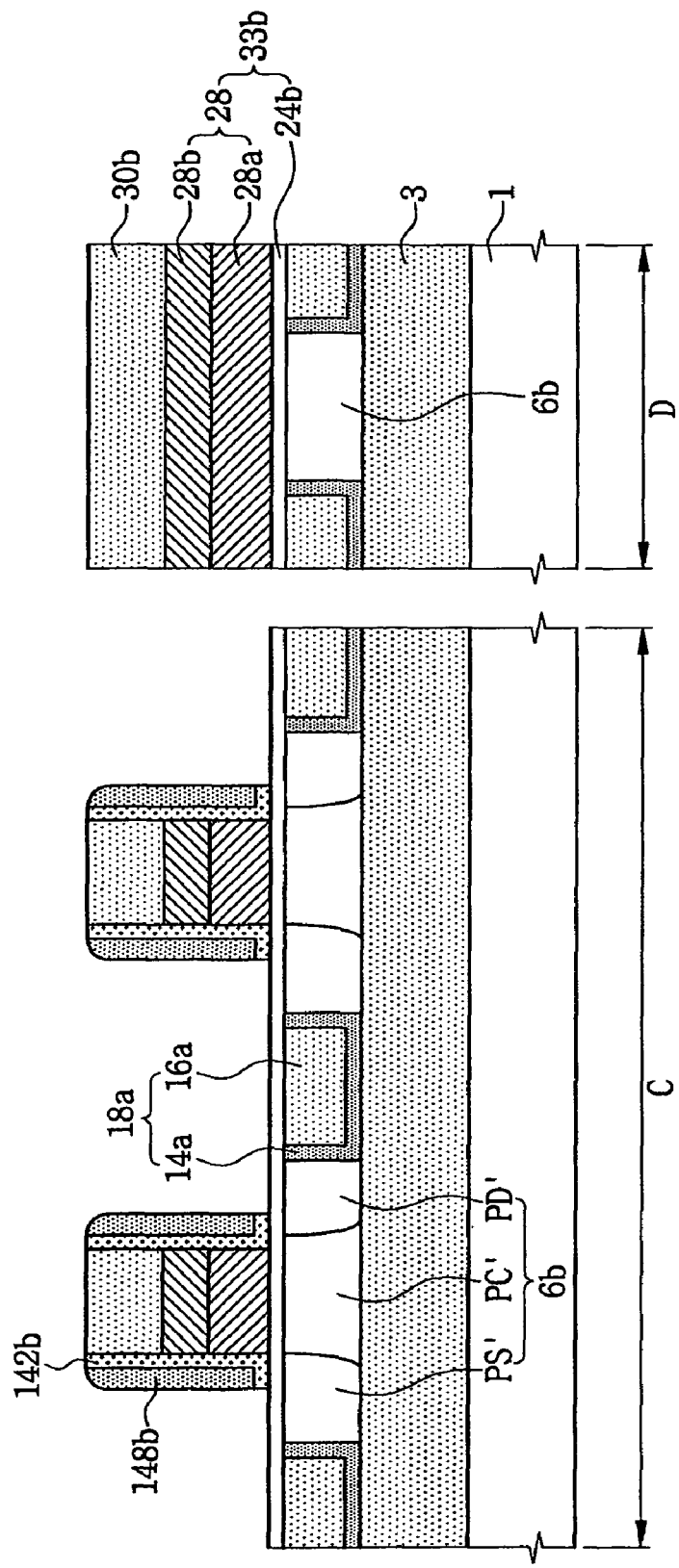

Referring to FIGS. 1, 13A, and 13B, a first peripheral impurity region PS' and a second peripheral impurity region PD' may be formed in the peripheral floating body pattern 6b at both sides of the peripheral gate pattern 33b. The peripheral floating body pattern 6b region between the first and second peripheral impurity regions PS' and PD' may be defined as a channel region PC'.

A first cell impurity region E/S' and a second cell impurity region C/D' may be formed in the cell floating body pattern 106a at both sides of the cell gate pattern 33a. The cell floating body pattern 106a region between the first and second cell impurity regions E/S' and C/D' may be defined as a channel region or a base (it is referred to as a base B/C' for convenience).

Comparing results of FIG. 12A with those of FIG. 8A, there is a great difference in width between the protrusion portions 7 and 107 of the cell floating body pattern 6a and 106a and the cell gate pattern 33a. As described above, the protrusion portion 107 of the cell floating body pattern 106a of FIG. 12A may be formed to have a greater width than the cell gate pattern 33a, and thus may ensure a volume capable of storing more charge in a capacitorless one-transistor DRAM cell.

Referring back to FIGS. 13A and 13B, first and second buffer regions 151a and 151b corresponding to the first and second buffer regions 45a and 45b described with reference to FIG. 9A may be formed. That is, as described with reference to FIG. 9A, the first and second buffer regions 151a and 151b may be formed between the base B/C' and respective ones of the first and second impurity regions E/S' and C/D.

According to example embodiments, methods of fabricating a semiconductor capable of increasing a data storage capability of a one-transistor DRAM device are provided. Further, MOS transistors having reliability can be provided in a peripheral circuit region of the one-transistor DRAM device.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of fabricating a semiconductor device, comprising:
    forming a first floating body pattern on a lower insulating layer of a substrate;
    forming a first gate pattern on the first floating body pattern, the first gate pattern crossing over the first floating body pattern and covering sidewalls of the first floating body pattern;
    partially etching the first floating body pattern at both sides of the first gate pattern to form etched regions at both sides of the first gate pattern, such that the first floating body pattern has a protrusion portion between the etched regions, and the protrusion extends above the etched regions; and
    forming first impurity regions in the etched regions of the first floating body pattern.

2. The method as claimed in claim 1, further comprising:
    forming a second floating body pattern spaced apart from the first floating body pattern on the insulating layer, forming of the first and second floating body patterns being simultaneous; and
    forming a second gate pattern crossing over the second floating body pattern, forming of the first and second gate patterns being simultaneous.

3. The method as claimed in claim 2, further comprising forming an isolation pattern surrounding sidewalls of the second floating body pattern.

4. The method as claimed in claim 3, wherein forming the isolation pattern comprises:
    forming an isolation layer on the substrate having the first and second floating body patterns, wherein the isolation layer includes an insulating liner and an isolation insulating layer on the insulating liner, the insulating liner being formed of a material layer having an etch selectivity with respect to the bottom insulating layer and the isolation insulating layer; and
    sequentially etching the isolation insulating layer and the insulating liner adjacent to the first floating body pattern to expose a top surface and a sidewall of the first floating body pattern.

5. The method as claimed in claim 1, further comprising forming gate spacers covering sidewalls of the first gate pattern and extending over sidewalls of the protrusion portion of the first floating body pattern before forming the first impurity regions.

6. The method as claimed in claim 1, further comprising forming first gate spacers covering sidewalls of the first gate pattern before forming the etched regions, wherein the first gate spacers and the first gate pattern are used as etch masks to partially etch the first floating body pattern.

7. The method as claimed in claim 6, further comprising forming second gate spacers covering the first gate spacers and extending over sidewalls of the protrusion portion of the first floating body pattern before forming the first impurity regions.

8. The method as claimed in claim 1, wherein the protrusion portion of the first floating body pattern is formed to have a greater width than a width of the gate pattern.

9. The method as claimed in claim 1, wherein the protrusion portion of the first floating body pattern is formed to have a smaller width than a distance between facing sidewalls of adjacent first impurity regions.

10. The method as claimed in claim 1, wherein the protrusion portion is formed not to overlap the first impurity regions.

11. The method as claimed in claim 1, wherein forming the first impurity regions includes defining at least a part of the first floating body pattern between the first impurity regions and at a lower part of the first gate pattern as a charge storage region of a DRAM cell.

12. The method as claimed in claim 1, wherein forming the first floating body pattern includes forming at least two regions of different characteristics, such that an upper region of the at least two regions is disposed in the protrusion portion of the first floating body pattern.

13. The method as claimed in claim 12, wherein partially etching the first floating body pattern includes removing the upper region of the at least two regions from both sides of the first gate pattern to form the recessed regions.

14. The method as claimed in claim 12, wherein the recessed regions are formed to have different characteristics than the protrusion portion.

* * * * *